United States Patent
Ha et al.

(10) Patent No.: US 12,068,157 B2
(45) Date of Patent: Aug. 20, 2024

(54) METHOD OF MANUFACTURING SEMICONDUCTOR DEVICE

(71) Applicant: Samsung Electronics Co., Ltd., Suwon-si (KR)

(72) Inventors: Hyun Seung Ha, Yongin-si (KR); Jang Hoon Kim, Seoul (KR); Tae-Kyu Kim, Hwaseong-si (KR); Young Kuk Byun, Suwon-si (KR); Jong Hyun Jung, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 446 days.

(21) Appl. No.: 17/385,069

(22) Filed: Jul. 26, 2021

(65) Prior Publication Data
US 2022/0172944 A1 Jun. 2, 2022

(30) Foreign Application Priority Data
Dec. 2, 2020 (KR) .................. 10-2020-0166728

(51) Int. Cl.
*H01L 21/027* (2006.01)
*G03F 7/00* (2006.01)
*G03F 7/20* (2006.01)
*H01L 21/66* (2006.01)

(52) U.S. Cl.
CPC ...... *H01L 21/0274* (2013.01); *G03F 7/70633* (2013.01); *H01L 22/12* (2013.01)

(58) Field of Classification Search
CPC ... H01L 21/0274; H01L 21/027; H01L 21/66; H01L 22/20; H01L 22/12; H01L 22/10; H01L 23/544; H01L 23/5226; H01L 23/528; H01L 22/14; G03F 7/70633; G03F 7/00; G03F 7/70683; G01B 11/14; G01B 11/26; G01B 11/272; G01B 11/27
See application file for complete search history.

(56) References Cited

U.S. PATENT DOCUMENTS

| | | | |
|---|---|---|---|
| 6,486,954 B1 | 11/2002 | Mieher et al. | |
| 6,819,426 B2 * | 11/2004 | Sezginer | H01L 22/34 356/400 |
| RE45,943 E * | 3/2016 | Huang | H01L 22/12 |
| 9,811,003 B2 | 11/2017 | Jak et al. | |
| 10,289,008 B2 | 5/2019 | Jak | |
| 10,990,023 B1 * | 4/2021 | Hsieh | G03F 7/70633 |
| 2019/0250521 A1 | 8/2019 | Amit et al. | |
| 2021/0199596 A1 * | 7/2021 | Asano | G03F 7/70633 |

FOREIGN PATENT DOCUMENTS

| | | |
|---|---|---|
| CN | 111123662 A | 5/2020 |
| JP | 2005317617 A | 11/2005 |
| KR | 101476080 B1 | 12/2014 |

* cited by examiner

*Primary Examiner* — Nikolay K Yushin
(74) *Attorney, Agent, or Firm* — Muir Patent Law, PLLC

(57) ABSTRACT

A method of manufacturing a semiconductor device includes forming a first lower overlay key including first and second patterns in a lower layer, forming a first upper overlay key including third and fourth patterns in an upper layer vertically disposed on the lower layer, irradiating a first measurement light to a first region of interest (ROI) over first portions of the first and second patterns to detect a first overlay error and irradiating a second measurement light to a second ROI over second portions of the first and second patterns, the second ROI being different from the first ROI, to detect a second overlay error.

20 Claims, 16 Drawing Sheets

| R | Recipe | | | Output | | | |
|---|---|---|---|---|---|---|---|
| OutputFile_R_1 | λc_R_1 | BW_R_1 | 3σ_R_1 | Periodic_Ratio_R_1 | CP_R_1 | Residual_R_1 |
| OutputFile_R_2 | λc_R_2 | BW_R_2 | 3σ_R_2 | Periodic_Ratio_R_2 | CP_R_2 | Residual_R_2 |
| OutputFile_R_3 | λc_R_3 | BW_R_3 | 3σ_R_3 | Periodic_Ratio_R_3 | CP_R_3 | Residual_R_3 |
| OutputFile_R_4 | λc_R_4 | BW_R_4 | 3σ_R_4 | Periodic_Ratio_R_4 | CP_R_4 | Residual_R_4 |
| OutputFile_R_5 | λc_R_5 | BW_R_5 | 3σ_R_5 | Periodic_Ratio_R_5 | CP_R_5 | Residual_R_5 |
| OutputFile_R_6 | λc_R_6 | BW_R_6 | 3σ_R_6 | Periodic_Ratio_R_6 | CP_R_6 | Residual_R_6 |

OA1(OA)

METHOD OF MANUFACTURING SEMICONDUCTOR DEVICE

CROSS-REFERENCE TO RELATED APPLICATION

This application claims priority to Korean Patent Application No. 10-2020-0166728 filed on Dec. 2, 2020 in the Korean Intellectual Property Office, the contents of which in its entirety are herein incorporated by reference.

BACKGROUND

1. Technical Field

The present disclosure relates to a method of manufacturing a semiconductor device.

2. Description of the Related Art

As semiconductor devices become highly integrated, the line width of patterns included in semiconductor devices is getting finer, and as complex processes and materials are applied to manufacturing processes, the difficulty of measuring and evaluating these processes is also increasing.

Due to the introduction of a new material or a complicated manufacturing process, the overlay key pattern for overlay measurement is attacked, step differences in a lower portion occur, or the like, and thus the overlay key is damaged. The difficulty of overlay measurement is increasing, and the damaged overlay key may make the overlay measurement inaccurate.

SUMMARY

Aspects of the present disclosure provide a method of manufacturing a semiconductor device in which the entire overlay key is divided into a plurality of regions of interest (ROI) to perform overlay measurement for each ROI.

Aspects of the present disclosure also provide a method of manufacturing a semiconductor device in which the accuracy of the overlay measurement is improved by optimizing an overlay recipe.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to some embodiments of the present inventive concept, there is provided a method of manufacturing a semiconductor device comprising forming a first lower overlay key including first and second patterns in a lower layer, forming a first upper overlay key including third and fourth patterns in an upper layer vertically disposed on the lower layer, irradiating a first measurement light to a first region of interest (ROI) over first portions of the first and second patterns to detect a first overlay error and irradiating a second measurement light to a second ROI over second portions of the first and second patterns, the second ROI being different from the first ROI, to detect a second overlay error.

According to some embodiments of the present inventive concept, there is provided a method of manufacturing a semiconductor device comprising forming a first lower overlay key including first and second patterns in a lower layer, forming a first upper overlay key including third and fourth patterns in an upper layer vertically disposed on the lower layer, irradiating a first measurement light to a first ROI over first portions of the third and fourth patterns to detect a first overlay error and irradiating a second measurement light to a second ROI over second portions of the third and fourth patterns, the second ROI being different from the first ROI, to detect a second overlay error, wherein the third and fourth patterns are photoresist patterns.

According to some embodiments of the present inventive concept, there is provided a method of manufacturing a semiconductor device comprising forming a first lower overlay key including first and second patterns extending in a first direction in a lower layer, and a second lower overlay key including third and fourth patterns in the lower layer, the third and fourth patterns extending in a second direction crossing the first direction, the second lower overlay key being a congruent shape of the first lower overlay key and being disposed by 90° rotation of the first lower overlay key about a first point on the lower layer, forming a first upper overlay key including fifth and sixth patterns extending in the first direction and a second upper overlay key including seventh and eighth patterns extending in the second direction, in an upper layer vertically disposed on the lower layer, irradiating a first measurement light to a first_first ROI over first portions of the first and second patterns and a second_first ROI over first portions of the third and fourth patterns to detect a first overlay error, the second_first ROI being a congruent shape of the first_first ROI and being disposed at a region determined by 90° rotation of the first_first ROI about the first point, and irradiating a second measurement light to a first_second ROI over second portions of the first and second patterns, the first_second ROI being different from the first_first ROI, and a second_second ROI over second portions of the third and fourth patterns, the second_second ROI being different from the second_first ROI, to detect a second overlay error, the second_second ROI being a congruent shape of the first_second ROI and being disposed at a region determined by 90° rotation of the first_second ROI about the first point.

BRIEF DESCRIPTION OF THE DRAWINGS

The above and other aspects and features of the present disclosure will become more apparent by describing in detail exemplary embodiments thereof with reference to the attached drawings, in which:

FIGS. 10 to 12 are diagrams illustrating intermediate steps of a method of manufacturing a semiconductor device according to some embodiments;

DETAILED DESCRIPTION OF THE EMBODIMENTS

Hereinafter, embodiments of the present disclosure will be described with reference to the accompanying drawings. In the following description made with reference to FIGS. 1 to 14, the same reference numbers are used to refer to substantially the same components, and a redundant description of the corresponding components will be omitted. Like reference numbers refer to like elements throughout the various drawings.

Figure 1:
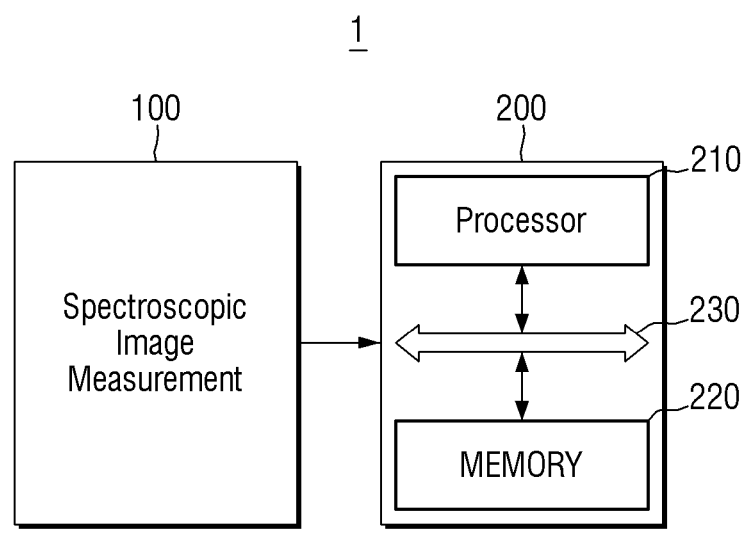
FIG. 1 is a schematic diagram illustrating an overlay error detection device used in a method of manufacturing a semiconductor device according to some embodiments of the present disclosure.

FIG. 1 is a schematic diagram illustrating an overlay error detection device used in a method of manufacturing a semiconductor device according to some embodiments of the present disclosure.

Referring to FIG. 1, an overlay error detection device 1 according to some embodiments of the present disclosure includes a spectroscopic image measurement equipment 100 and a computing system 200.

The spectroscopic image measurement equipment 100 irradiates the semiconductor substrate with measurement light and measures a characteristic value of the semiconductor substrate from the reflection light. For example, the measurement light may be reflected from the semiconductor substrate, which is called the reflection light (i.e., the reflected light). For example, the spectroscopic image measurement equipment 100 analyzes the semiconductor substrate by detecting the polarization state and diffraction of the reflection light, which corresponds to the measurement light reflected from the sample (e.g., the semiconductor substrate). This polarization state may be described as Ψ (psi) and Δ (delta), where Ψ (psi) is the reflection coefficient ratio of the p-wave and the s-wave, and Δ (delta) is a phase difference between the p-wave and the s-wave. Accordingly, the spectroscopic image measurement equipment 100 measures the complex refractive index or the like of the material constituting the semiconductor substrate based on the wavelength of the measurement light, and provides the thickness of the thin film including the semiconductor substrate, as well as various information including a complex refractive index, a shape, a crystal state, a chemical structure, an electrical conductivity, or the like, on a sample, that is, a semiconductor substrate, thereby detecting the degree of alignment between the lower layer and the upper layer.

The spectroscopic image measurement equipment 100 uses an image sensor or a camera equipped with an image sensor as a detector for detecting reflection light. However, the scope of the present disclosure is not limited to using only the spectroscopic image measurement equipment 100. For example, various embodiments of the present disclosure may be using an image sensor or a camera equipped with an image sensor as a detector, but may be implemented using an image measurement equipment that uses light of several wavelengths as measurement light. A detailed description of the spectroscopic image measurement equipment 100 will be described later with reference to FIG. 2.

The computing system 200 receives the data measured by the spectroscopic image measurement equipment 100, for example, data regarding the polarization state of the reflection light which are expressed using as Ψ (psi) and Δ (delta), and analyzes the data.

In some embodiments of the present disclosure, the computing system 200 includes a processor 210 and a memory 220, and the processor 210 and the memory 220 may exchange data through a bus 230. For example, the data measured by the spectroscopic image measurement equipment 100 may be transmitted to the computing system 200 and then stored in the memory 220 of the computing system 200. The data measured in the memory 220 may be illustrated as a graph through analysis software or an application executed on the processor 210, or may be subjected to various analysis processes.

The memory 220 may save the disposition and size of an ROI, which will be described later, the recipe information that is setting information for overlay measurement, such as the center wavelength, bandwidth, spectral structure of the measurement light, a kernel 3 sigma that indicates the degree of overlay error between the upper and lower layers, a periodic_ratio, a contrast, or the like, as one output file. The kernel 3 sigma can be obtained through standard deviation (σ) of overlay error residual data using the kernel principal component analysis model. The periodic ratio can be obtained using periods of upper patterns in upper overlay keys and periods of lower patterns of lower overlay keys to be described. The contrast can be obtained as a contrast to images of overlay keys.

In some embodiments of the present disclosure, the computing system 200 may include a portable computer such as a desktop computer, a server, a notebook computer, and a laptop computer, as well as a mobile computer including a smartphone, a tablet computer, or the like, but the scope of the present disclosure is not limited thereto. On the other hand, in some embodiments of the present disclosure, the computing system 200 may be directly connected to the spectroscopic image measurement equipment 100 (for example, through a cable), or may be connected through a wired network including a local area network (LAN), a wide area network (WAN), or the like or through a wireless network including a WiFi network, a cellular network, or the like, to exchange data with each other.

Figure 2:
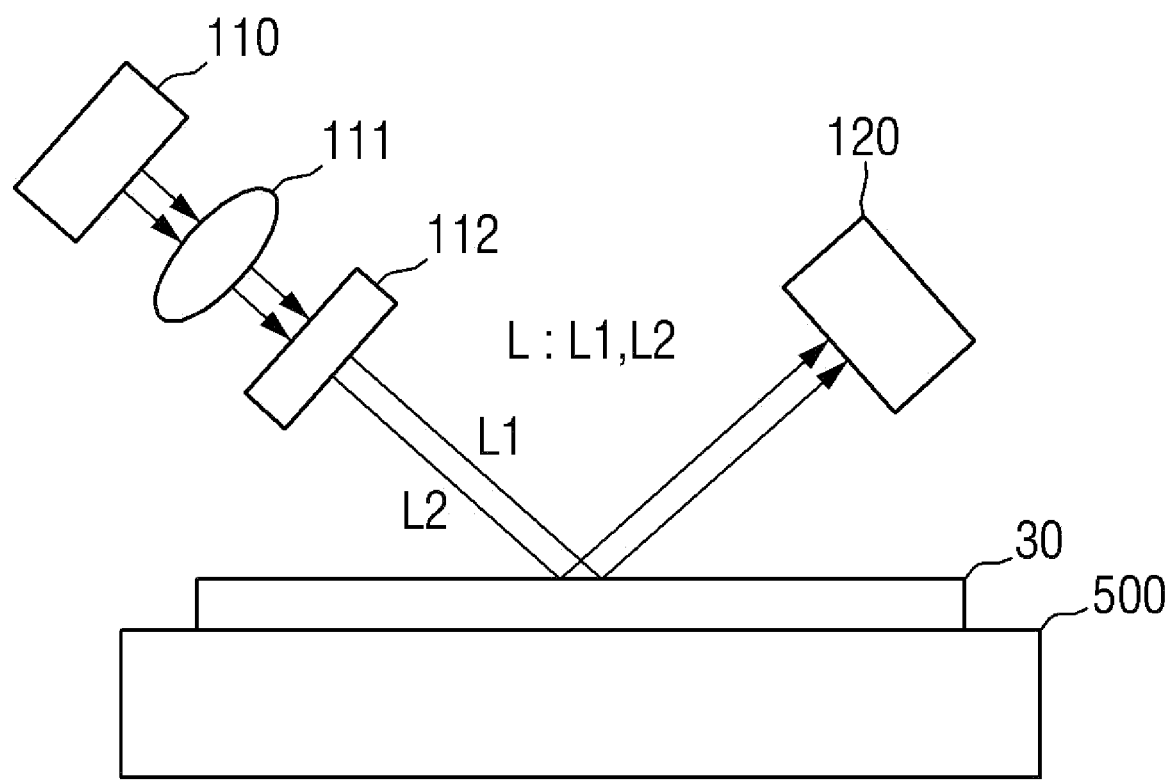
FIG. 2 is a schematic diagram illustrating a spectroscopic image measurement equipment used in a method of manufacturing a semiconductor device according to some embodiments of the present disclosure.

FIG. 2 is a schematic diagram illustrating a spectroscopic image measurement equipment used in a method of manufacturing a semiconductor device according to some embodiments of the present disclosure.

Referring to FIG. 2, the spectroscopic image measurement equipment 100 may include a light source 110, a spectroscope 111, a filter 112, an image sensor 120, and a stage 500. As described above with respect to FIG. 1, the spectroscopic image measurement equipment 100 may use light generated by mixing light including a continuous wavelength band as measurement light L, but is not limited thereto, and light of a short wavelength may be used according to an embodiment. In an embodiment, the measurement light L may include a first measurement light L1 and a second measurement light L2.

In some embodiments of the present disclosure, the light source 110 may be a white light source, but the present disclosure is not limited thereto.

Meanwhile, the spectroscope 111 and the filter 112 may be used to convert light emitted from the light source 110 into light having a specific wavelength or light having a wavelength of a specific band.

The spectroscope 111 disperses the light emitted from the light source 110 according to the wavelength, and provides the dispersed light to the filter 112. The filter 112 receiving the dispersed light may generate the measurement light L and irradiate the measurement light L to the semiconductor substrate 30, may adjust the center wavelength of the measurement light L and the wavelength band of the measurement light L, and may determine the spectral structure (for example, single pass band or double pass band) of the wavelength of the measurement light L.

Although not illustrated, light generated from the filter 112 is polarized by a polarizer, and is used to irradiate the sample (e.g., the semiconductor substrate 30) at an optional angle of incidence through the illumination optical system. In some embodiments of the present disclosure, the light generated from the filter 112 may be used to irradiate the semiconductor substrate 30 through a compensator as well as a polarizer, or may be used to irradiate the semiconductor substrate 30 through a phase modulator instead of the compensator.

The image sensor 120 may receive measurement light reflected from the semiconductor substrate 30, measure a change in polarization, a degree of diffraction, a change in energy intensity, or the like as an image, and detect an overlay error between upper and lower layers. Data collected in the form of an image may be transmitted to and processed by the computing system 200 illustrated in FIG. 1.

The spectroscopic image measurement equipment 100 may perform measurement on the semiconductor substrate 30 positioned on the stage 500.

Although not illustrated, the semiconductor substrate 30 may be moved onto the stage 500 after an exposure process is performed at the outside. However, embodiments according to the technical spirit of the present disclosure are not limited thereto. For example, after etching is performed in the etching device, the semiconductor substrate 30 may be transferred to the stage 500.

Figure 3:
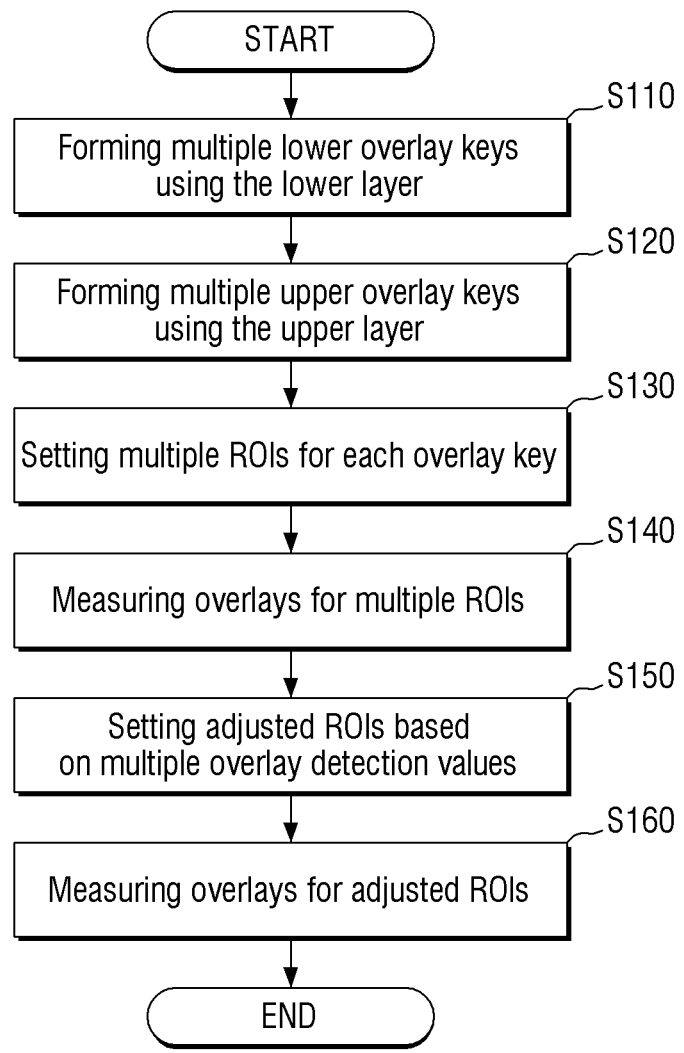
FIG. 3 is a flowchart illustrating a method of manufacturing a semiconductor device according to some embodiments of the present disclosure.

FIG. 3 is a flowchart illustrating a method of manufacturing a semiconductor device according to some embodiments of the present disclosure.

Referring to FIG. 3, in a method of manufacturing a semiconductor device according to some embodiments, a plurality of lower overlay keys are formed on a lower layer (step S110). A plurality of lower overlay keys are formed on an upper layer vertically disposed on the lower layer (step S120).

Figure 4:
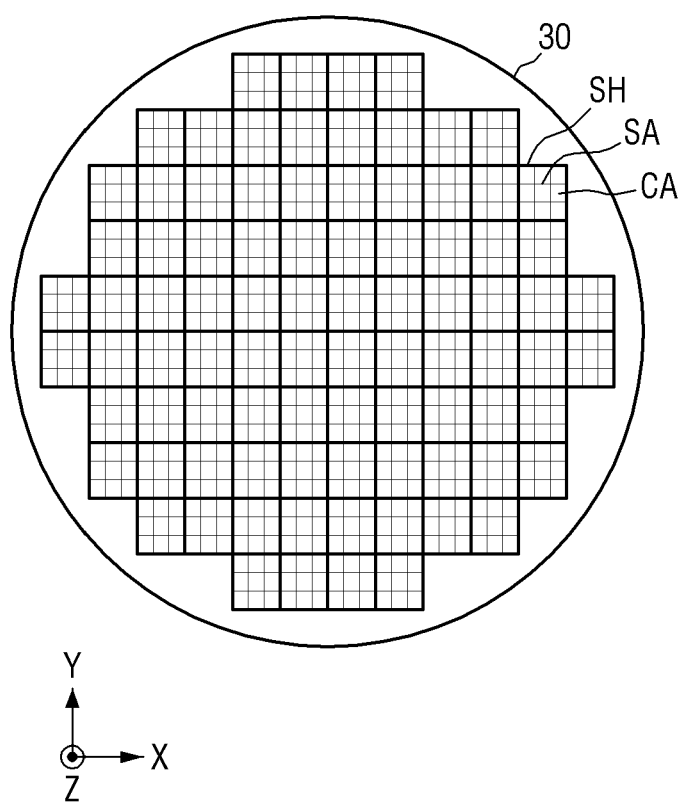
FIG. 4 is a diagram illustrating a semiconductor substrate according to some embodiments of the present disclosure.
Figure 5:
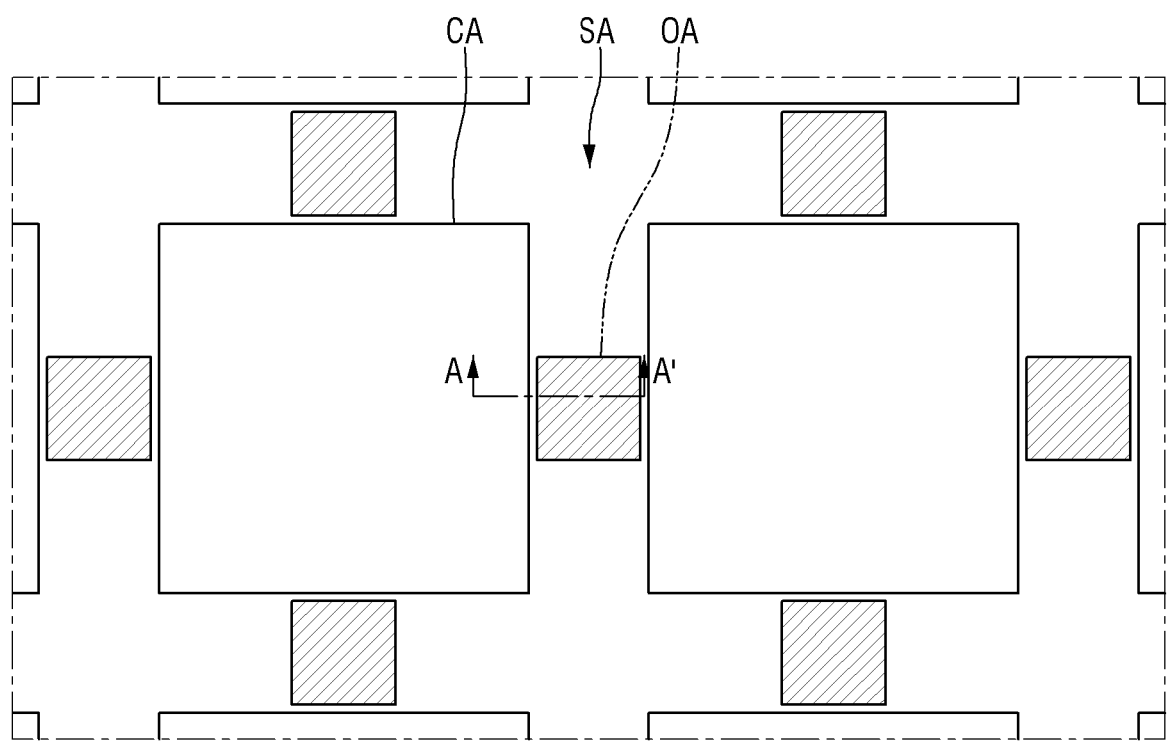
FIG. 5 is a partially enlarged view of the semiconductor substrate of FIG. 4.
Figure 6:
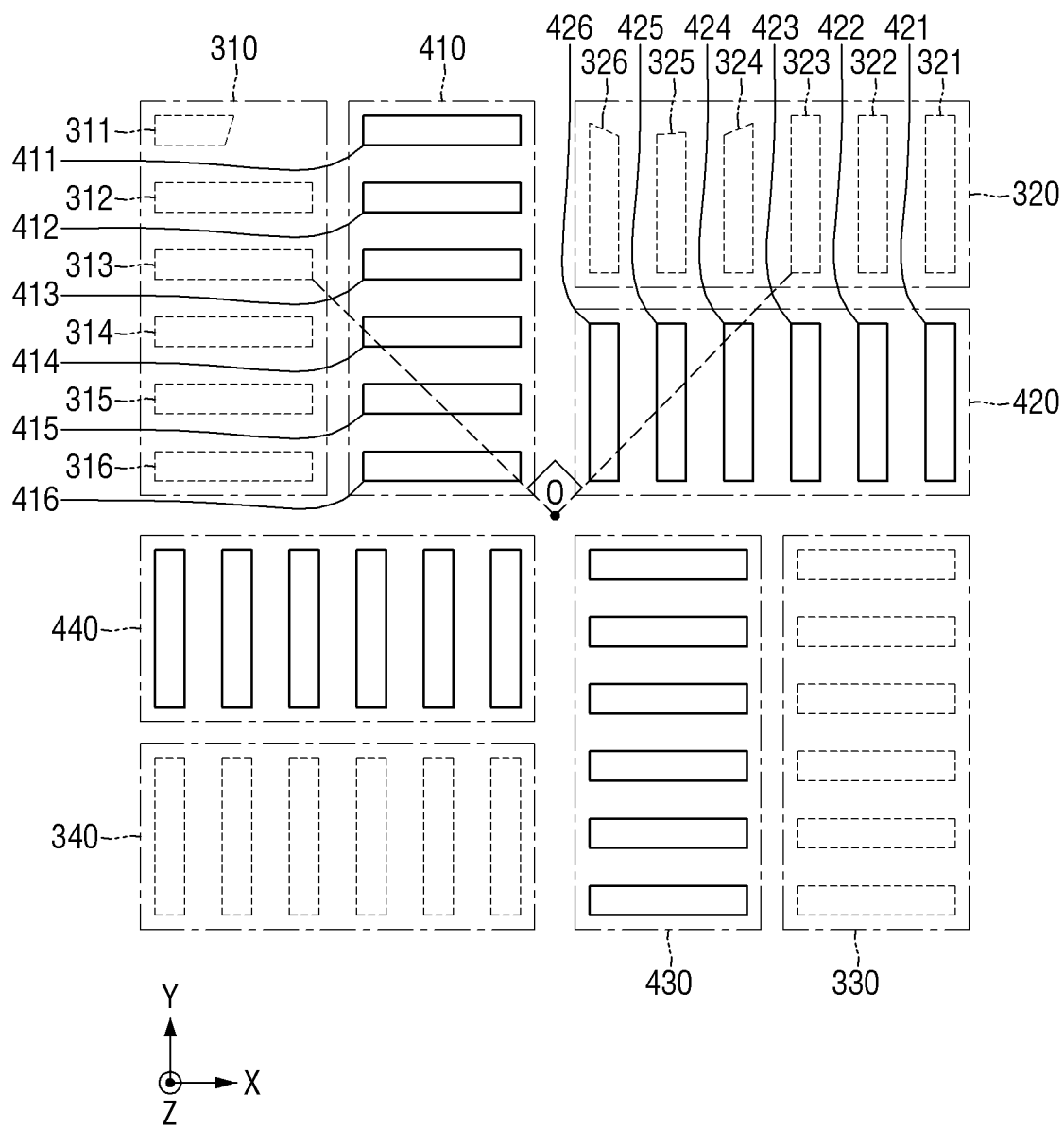
FIG. 6 is an enlarged view of an overlay key area of FIG. 5.
Figure 7A:
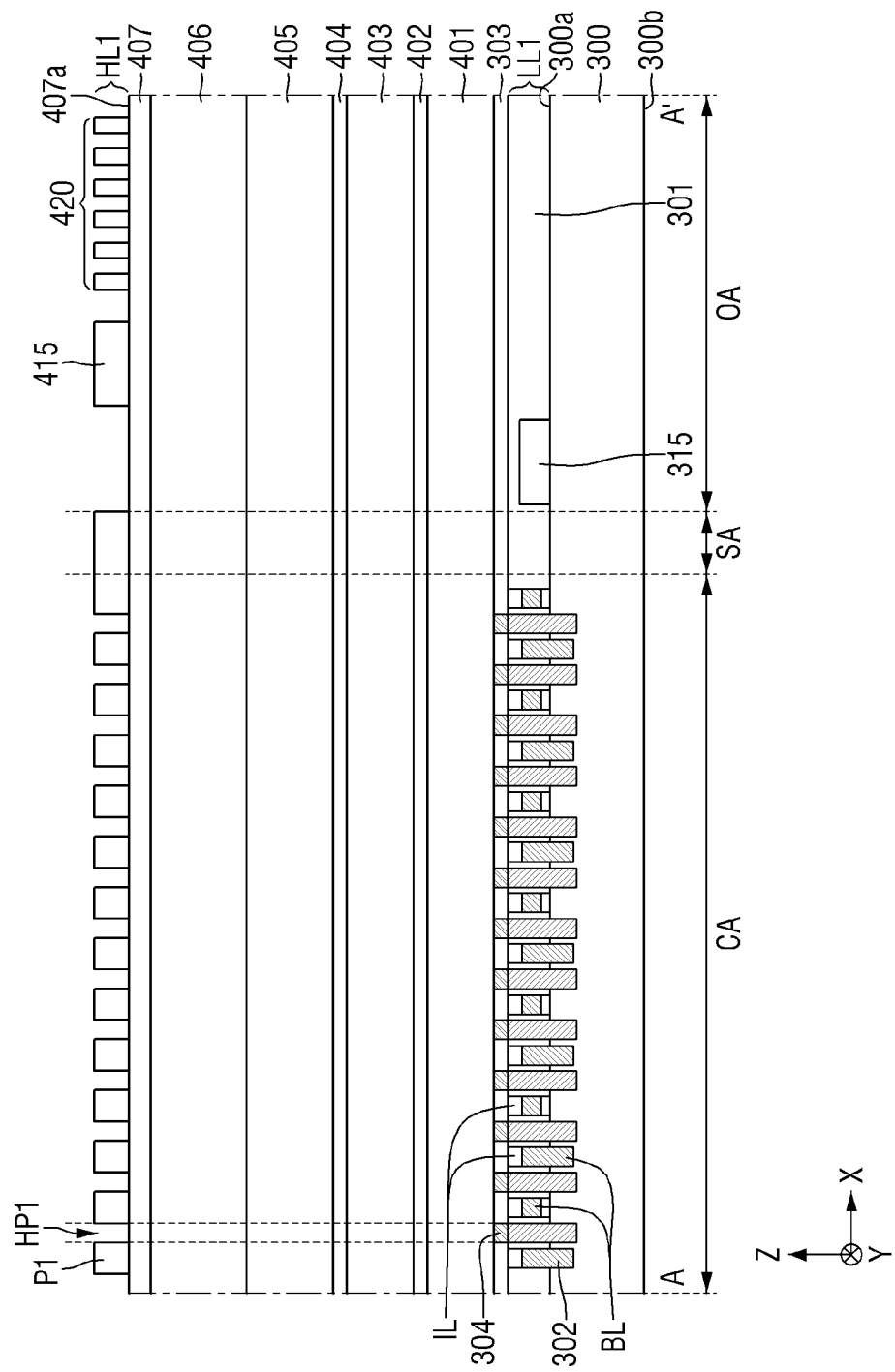
FIG. 7A is an exemplary cross-sectional view of a semiconductor substrate taken along line A-A of FIG. 5.
Figure 7B:
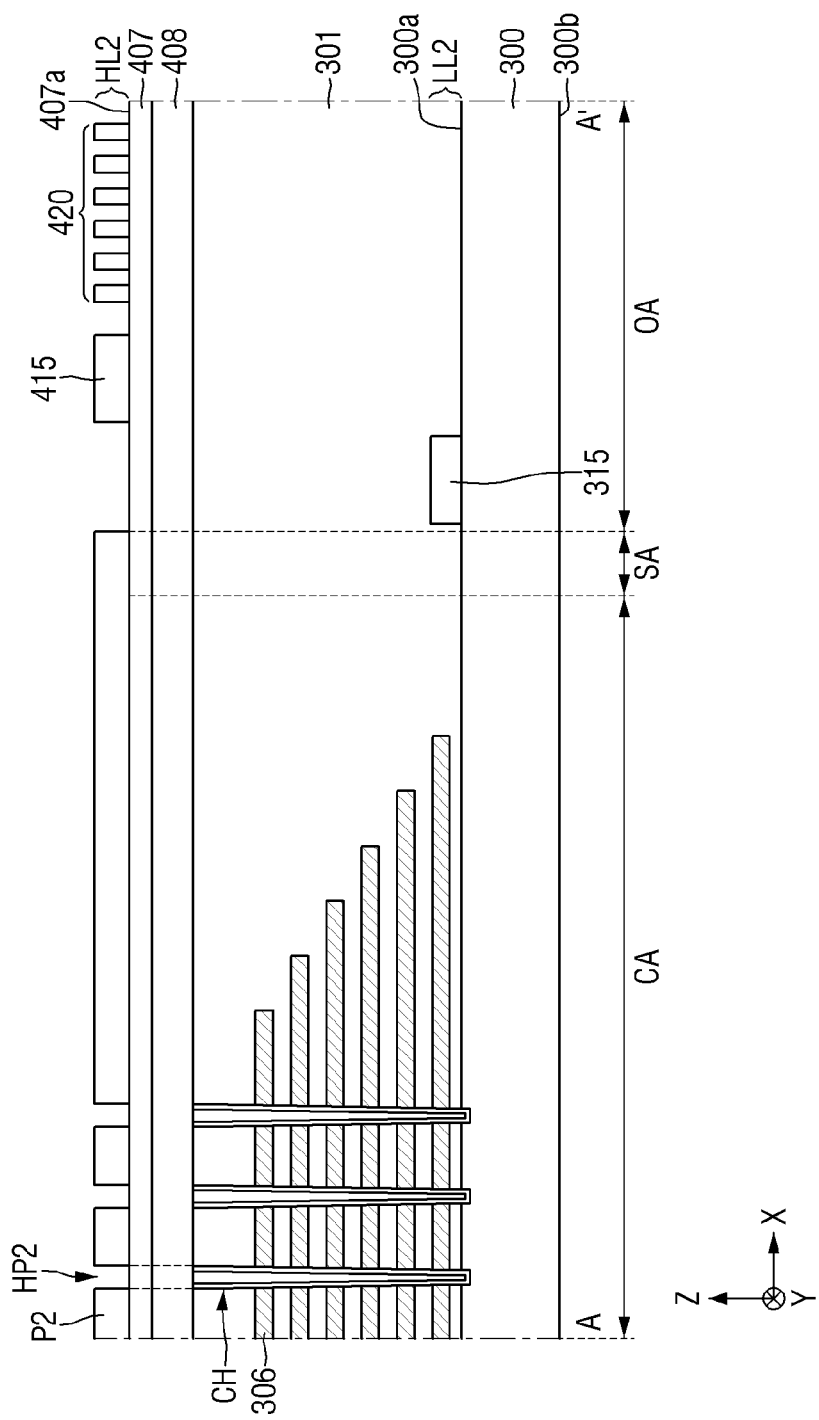
FIG. 7B is another exemplary cross-sectional view of a semiconductor substrate taken along line A-A of FIG. 5.
Figure 7C:
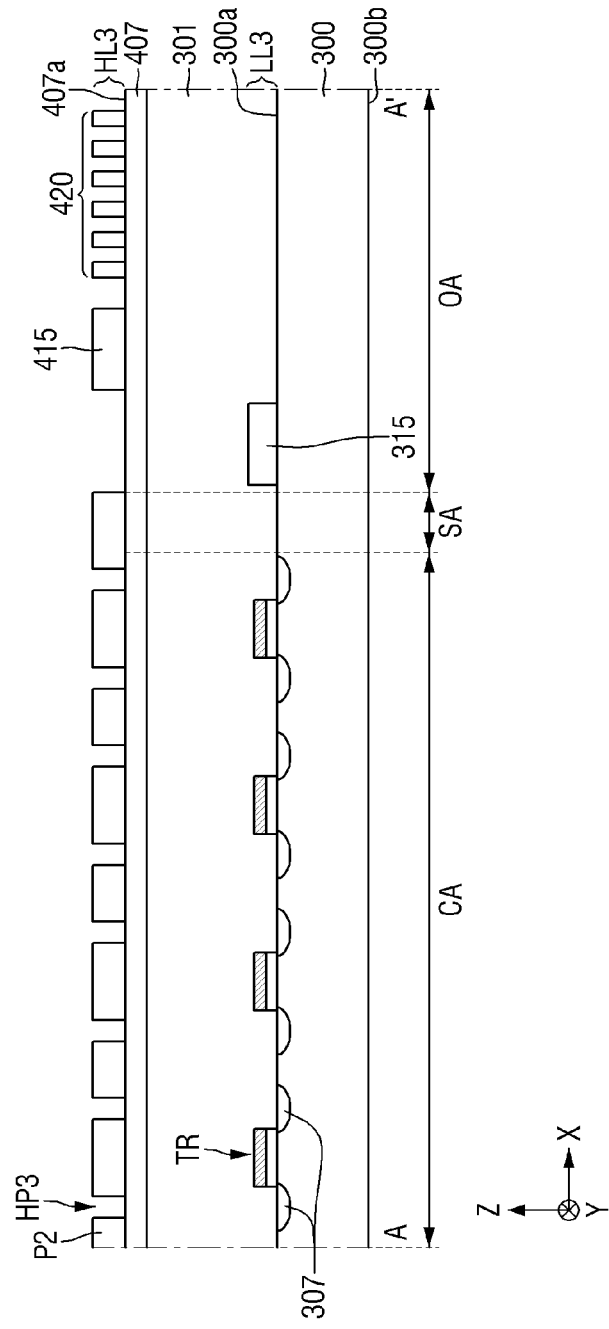
FIG. 7C is still another exemplary cross-sectional view of a semiconductor substrate taken along line A-A of FIG. 5.

FIG. 4 is a diagram illustrating a semiconductor substrate according to some embodiments of the present disclosure. FIG. 5 is a partially enlarged view of the semiconductor substrate of FIG. 4. FIG. 6 is an enlarged view of an overlay key area of FIG. 5. FIG. 7A is an exemplary cross-sectional view of a semiconductor substrate taken along line A-A' of FIG. 5. FIG. 7B is an exemplary cross-sectional view of a semiconductor substrate taken along line A-A' of FIG. 5. FIG. 7C is an exemplary cross-sectional view of a semiconductor substrate taken along line A-A' of FIG. 5.

Referring to FIGS. 4 to 7C, first to fourth lower overlay keys 310 to 340 may be formed on the substrate 300 by using lower layers LL1 to LL3, and first to fourth upper overlay keys 410 to 440 may be formed by using upper layers HL1 to HL3 vertically disposed higher than the lower layers LL1 to LL3 in a third direction Z.

The semiconductor substrate 30 may correspond to the semiconductor substrate 30 disposed on the stage 500 of FIG. 2.

Referring to FIGS. 4 and 5, a semiconductor substrate 30 may include a plurality of shot areas SH. The shot area SH may be an area exposed by a single exposure process in a photolithography process. One shot area SH may be one chip area CA or a plurality of chip areas CA. The chip area CA may include a plurality of circuit areas. In some embodiments, the semiconductor substrate 30 may include the plurality of circuit areas formed on a substrate 300 as shown in FIG. 7A, for example.

A scribe lane area SA may be disposed between the plurality of chip areas CA. Here, the chip area CA may be defined by the scribe lane area SA. For example, the scribe lane area SA may surround the chip area CA. For example, the semiconductor substrate 30 may further include the scribe lane area SA surrounding each of the plurality of chip areas CA. The plurality of chip areas CA may be cut into individual chips along the scribe lane area SA, and after the plurality of chip areas CA are cut, each individualized chip may include part of the scribe lane area SA.

In some embodiments, the overlay key area OA may be disposed on the semiconductor substrate 10. For example, the overlay key area OA may be disposed on the scribe lane area SA. However, embodiments according to the technical spirit of the present disclosure are not limited thereto. In some embodiments, the overlay key area OA may be disposed on the chip area CA. In some embodiments, at least one overlay key area may be disposed on the chip area CA and at least one overlay key area may be disposed on the scribe lane area SA. Hereinafter, it is assumed that the overlay key area OA is disposed on the scribe lane area SA.

Referring to FIGS. 6 and 7A, the semiconductor substrate 30 may include a chip area CA and an overlay key area OA1. The chip area CA and the overlay key area OA1 may be spaced apart from each other. For example, the semiconductor substrate 30 illustrated in FIG. 5 may be the semiconductor substrate 30 after an exposure process and an etching process or exposure and development are performed on the upper layer HL1.

FIG. 7A illustrates an embodiment to which a method of manufacturing a semiconductor device of the present disclosure may be applied in a memory device. The memory device may include a volatile memory device such as a static random access memory (SRAM) and a dynamic random access memory (DRAM), but may also include a nonvolatile memory device such as flash memory, phase-change random access memory (PRAM), and resistive random-access memory (RRAM).

For example, a contact 302, a contact plug 304, mold layers 401 and 403, supporter layers 402 and 404, a first mask layer 405, a second mask layer 406, an anti-reflection layer 407, and a first chip pattern P1 may be formed on the substrate 300 in the chip area CA. For example, the first to fourth lower overlay keys 310 to 340, the mold layers 401 and 403, the supporter layers 402 and 404, the first mask layer 405, the second mask layer 406, the anti-reflection layer 407, and the first to fourth upper overlay keys 410 to 440 may be formed on the substrate 300 in the overlay key area OA1.

The contact 302 may be disposed on a first surface 300a of the substrate 300, and may be in contact with source/drain regions disposed on the substrate 300. The contact 302 may extend in the third direction Z to be in contact with the contact plug 304 included in an insulating layer 303 and be electrically connected to the contact plug 304. The contact 302 is illustrated as a single layer in the drawing, but may include or may be formed of a plurality of conductive layers such as a contact layer, a silicide layer, a landing pad, or the like. An interlayer insulating layer 301 may be disposed among the components disposed between the substrate 300 and the insulating layer 303, and the components may be generated based on patterns formed using the lower layer LL1. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

The contact plug 304 may be disposed to be aligned with a first hole pattern HP1 formed by the first chip pattern P1, and the alignment may be achieved through the disposition of the first to fourth lower overlay keys 310 to 340 and the first to fourth upper overlay keys 410 to 440 to be described later.

A bit line BL may extend in a second direction Y between the contacts 302. A separate insulating material IL may be disposed between the insulating layer 303 and the bit line BL, and according to an embodiment, the insulating material IL may be a spacer. Some portions of each bit line BL may be spaced apart from the substrate 300, and some portions of each bit line BL may be connected to the substrate 300 for electrical connection thereto.

The mold layers 401 and 403 and the supporter layers 402 and 404 may be alternately stacked on the insulating layer 303, and the first mask layer 405, the second mask layer 406, and the anti-reflection layer 407 may be sequentially stacked on the supporter layer 404.

The mold layers 401 and 403 may include or may be formed of silicon oxide, for example, and the supporter layers 402 and 404 may include or may be formed of silicon nitride, but are not limited thereto. The first mask layer 405 may include or may be formed of silicon oxide, and the second mask layer 406 may include or may be formed of spin on hardmask (SOH), but is not limited thereto. The anti-reflection layer 407 may include or may be formed of silicon nitride or silicon oxynitride. For example, the anti-reflection layer 407 may be silicon oxynitride.

The first chip pattern P1 may be disposed on a first surface 407a of the anti-reflection layer 407, and may be formed by performing exposure and etching (or exposure and developing) on the upper layer HL1. The upper layer HL1 may include or may be formed of photoresist or metal. The present invention is not limited thereto. For example, the upper layer HL1 may include or may be formed of a carbon compound. For the upper layer HL1 of metal or a carbon compound, the first to fourth upper overlay keys 410 to 440 (e.g., the first_fifth upper pattern 415 of the first upper overlay key 410 and the second upper overlay key 420 as shown in FIG. 7A) may be formed by exposure and etching, and for the upper layer HL1 of photoresist, the first to fourth upper overlay keys 410 to 440 may be formed by exposure and developing. In the case where the upper layer HL1 is formed of photoresist, the first chip pattern P1, and the first to fourth upper overlay keys 410 to 440 may be a photoresist pattern.

According to an embodiment, the first chip pattern P1 may be a photoresist pattern on which EUV patterning is performed. The EUV is light having a wavelength within the range of from 4 nm to 124 nm, and for example in the present disclosure, a wavelength within the range of from 4 nm to 20 nm may be used, and the EUV light may be generated by laser applied to a plasma source material (for example, TiN). The photoresist may be polumethylmethacrylate (PMMA), poly(4-hydroxystryrene), or the like, but is not limited thereto.

The first hole pattern HP1 between two adjacent first chip patterns P1 may be formed to be aligned with the contact plug 304 in the third direction Z, a lower electrode (e.g., a lower electrode of a memory cell) may be formed along the first hole pattern HP1, and the lower electrode may be in contact with the contact plug 304 or may be electrically connected to the contact plug 304 to form a memory cell structure. In such alignment, a photomask for forming the first chip patterns P1 may have overlay key patterns corresponding to the first to fourth upper overlay keys 410 to 440, and may be aligned to the first to fourth lower overlay keys 310 to 340.

The first to fourth lower overlay keys 310 to 340 may be disposed on the first surface 300a of the substrate 300 and may be formed by patterning the upper layer HL1. The first to fourth lower overlay keys 310 to 340 may be formed by performing exposure and etching (or exposure and developing) on the lower layer LL1. The lower layer LL1 may include or may be formed of photoresist or metal. The present invention is not limited thereto. For example, the lower layer LL1 may include or may be formed of a carbon compound. For the lower layer LL1 of metal or a carbon compound, the first to fourth lower overlay keys 310 to 340 may be formed by exposure and etching, and for the lower layer LL1 of photoresist, the first to fourth lower overlay keys 310 to 340 may be formed by exposure and developing. In case where the lower layer LL1 is formed of photoresist, the first to fourth lower overlay keys 310 to 340 may be photoresist patterns.

The first lower overlay key 310 may include first_first to first_sixth lower patterns 311 to 316. Each of the first_first to first_sixth lower patterns 311 to 316 may extend in a first direction X, and the first_first to first_sixth lower patterns 311 to 316 may be disposed along a line extending in the second direction Y. Depending on an embodiment, the first_first to first_fifth lower patterns 311 to 315 may have a rectangular shape in a plan view, but the first_sixth lower patterns 316 may be a defective pattern since a partial area thereof is damaged to be different from the first_first to first_fifth lower patterns 311 to 315 in shape. The damage or the like may occur to at least one of the first_first to first_sixth lower patterns 311 to 316 by a process performed on the chip area CA.

A second lower overlay key 320 may be disposed by being rotated 90° clockwise about an origin O (or a first point) of the overlay area OA1 with respect to the first lower overlay key 310. For example, a second-third lower pattern 323 may be disposed by being rotated 90° clockwise about the origin O with respect to the first_third lower patterns 313. However, depending on an embodiment, some patterns may be damaged to be a defective pattern, and the second_first to second-third lower patterns 321 to 323 may have a rectangular shape in a plan view, but second_fourth to second_sixth lower patterns 324 to 326 may be defective patterns with a partial area being damaged to be different from the second_first to second-third lower patterns 321 to 323 in shape. In an embodiment, when no damage occurs to the first and second lower overlay keys 310 and 320, the first lower overlay key 310 and the second lower overlay key 320 are the same as each other in shape (i.e., congruent), except for orientations and locations at the overlay area OA1.

A third lower overlay key 330 may be disposed by being rotated 90° clockwise about the origin O of the overlay area OA1 with respect to the second lower overlay key 320, and a fourth lower overlay key 340 may be disposed by being rotated 90° clockwise about the origin O of the overlay area OA1 with respect to the third lower overlay key 330. However, lower patterns included in the third lower overlay key 330 and the fourth lower overlay key 340 may have a rectangular shape in a plan view. In an embodiment, when no damage occurs to the first to fourth lower overlay keys 310 to 340, the first to fourth lower overlay keys 310 to 340 are the same as each other in shape, except for orientations and locations at the overlay area OA1.

The insulating layer 303, the mold layers 401 and 403, and the supporter layers 402 and 404 may be alternately stacked on the first to fourth lower overlay keys 310 to 340, and the first mask layer 405, the second mask layer 406, and the anti-reflection layer 407 may be sequentially stacked on the supporter layer 404. The interlayer insulating layer 301 may be disposed between the first to fourth lower overlay keys 310 to 340, and between the insulating layer 303 and the first to fourth lower overlay keys 310 to 340.

The first to fourth upper overlay keys 410 to 440 may be disposed on the first surface 407a of the anti-reflection layer 407 and may be formed by patterning the upper layer HL1. The first to fourth upper overlay keys 410 to 440 may be formed by performing exposure and etching (or exposure and developing) on the upper layer HL1. The upper layer HL1 may include or may be formed of photoresist or metal. The present invention is not limited thereto. For example, the upper layer HL1 may include or may be formed of a carbon compound. For the upper layer HL1 of metal or a carbon compound, the first to fourth upper overlay keys 410 to 440 may be formed by exposure and etching, and for the upper layer HL1 of photoresist, the first to fourth upper overlay keys 410 to 440 (e.g., the first_fifth upper pattern 415 of the first upper overlay key 410 and the second upper overlay key 420 as shown in FIG. 7A) may be formed by exposure and developing. In case where the upper layer HL1 is formed of photoresist, the first to fourth upper overlay keys 410 to 440 may be photoresist patterns.

The first to fourth upper overlay keys 410 to 440 may be disposed so as not to overlap the first to fourth lower overlay keys 310 to 340 in a plan view.

The first upper overlay key 410 may include the first_first to first_sixth upper patterns 411 to 416. Each of the first_first to first_sixth upper patterns 411 to 416 may extend in the first direction X, and the first_first to first_sixth upper patterns 411 to 416 may be disposed along a line extending in the second direction Y. According to an embodiment, the first_first to first_sixth upper patterns 411 to 416 may have a rectangular shape in a plan view.

A second upper overlay key 420 may be disposed by being rotated 90° clockwise about an origin O of the overlay area OA1 with respect to the first upper overlay key 410. For example, a second_sixth upper pattern 426 may be disposed by being rotated 90° clockwise about the origin O with respect to the first_sixth upper pattern 416. According to an embodiment, the second_first to second_sixth upper patterns 421 to 426 may have a rectangular shape in a plan view. In an embodiment, when no damage occurs to the first and second upper overlay keys 410 and 420, the first upper overlay key 410 and the second upper overlay key 420 are the same as each other in shape, except orientation and locations at the overlay area OA1.

A third upper overlay key 430 may be disposed by being rotated 90° clockwise about the origin O of the overlay area OA1 with respect to the second upper overlay key 420, and a fourth upper overlay key 440 may be disposed by being rotated 90° clockwise about the origin O of the overlay area OA1 with respect to the third upper overlay key 430. According to an embodiment, patterns included in the third upper overlay key 430 and the fourth upper overlay key 440 may have a rectangular shape in a plan view. In an embodiment, when no damage occurs to the first to fourth upper overlay keys 410 to 440, the first to fourth upper overlay keys 410 to 440 are the same as each other in shape, except for orientations and locations at the overlay area OA1.

The first to fourth lower overlay keys 310 to 340 and the first to fourth upper overlay keys 410 to 440 may not overlap each other in a plan view, and may be disposed in a square shape in a plan view. Using the first to fourth lower overlay keys 310 to 340 and the first to fourth upper overlay keys 410 to 440, the first hole pattern HP1 and the contact plug 304 may be arranged in the third direction Z (i.e., may be aligned with each other in the third direction Z). For example, in such an alignment, a photomask for forming the first chip patterns P1 and the first hole pattern HP1 may have overlay key patterns corresponding to the first to fourth upper overlay keys 410 to 440, and the overlay key patterns of the photomask may be aligned with the first to fourth lower overlay keys 310 to 340 such that the first hole pattern HP1 aligned with the contact plug 304 may be formed via exposure and etching or exposure and developing using the photomask. In some embodiments, the first to fourth upper overlay keys 410 to 440 may be used as reference overlay keys for subsequent exposure and etching or exposure and developing.

FIG. 7B is an exemplary cross-sectional view of a semiconductor substrate taken along line A-A' of FIG. 5. Hereinafter, a method of manufacturing a semiconductor device according to some embodiments of the present disclosure which may be applied to a storage device will be described with reference to FIG. 7B. Differences from the memory devices illustrated in FIG. 7A will be mainly described.

The storage device may include a nonvolatile memory (NVM) that stores data. The nonvolatile memory may be a V-NAND flash memory of a 2-dimensional (2D) structure or a 3-dimensional (3D) structure. The present invention is not limited thereto. For example, the nonvolatile memory may be other types of nonvolatile memories such as PRAM and/or RRAM.

For example, a plurality of conductive layers 306, an insulating layer 408, the anti-reflection layer 407, and a second chip pattern HP2 may be formed on the substrate 300 in the chip area CA. For example, the first to fourth lower overlay keys 310 to 340, the insulating layer 408, the anti-reflection layer 407, and the first to fourth upper overlay keys 410 to 440 may be formed on the substrate 300 in the overlay key area OA.

The substrate 300, the anti-reflection layer 407, the second upper layer HL2, a second lower layer LL2, the second chip pattern HP2, the first to fourth lower overlay keys 310 to 340, and the first to fourth upper overlay keys 410 to 440 correspond to the substrate 300, the anti-reflection layer 407, the first chip pattern HP1, the first upper layer HL1, the first lower layer LL1, the first to fourth lower overlay keys 310 to 340, and the first to fourth upper overlay keys 410 to 440 of FIG. 7A, respectively. The descriptions thereof will be omitted.

The plurality of conductive layers 306 may be stacked on the substrate 300 in the third direction Z. The conductive layer 306 adjacent to the substrate 300 may extend to partially protrude in the first direction X compared to the conductive layer 306 adjacent to the insulating layer 408, so that the plurality of conductive layers 306 may form a step structure. The plurality of conductive layers 306 may include a plurality of word lines, a string selection line, a ground selection line, and the like in the storage device.

A channel structure CH may extend in the third direction Z perpendicular to the top surface of the substrate 300 to penetrate the plurality of conductive layers 306. The channel structure CH may include a data storage layer, a channel layer, a buried insulating layer, and the like.

The insulating layer 408 may be formed on the channel structure CH, and a bit line plug may be formed in the insulating layer 408 through a post process. The anti-reflection layer 407 and the second chip pattern P2 may be formed on the insulating layer 408.

As described with reference to FIG. 7A, the second hole pattern HP2 and the channel structure CH may be aligned to each other in the third direction Z through the disposition of the first to fourth lower overlay keys 310 to 340 and the first to fourth upper overlay keys 410 to 440. A bit line plug may be formed along the second hole pattern HP2, and the bit line plug may electrically connect the bit line to the channel structure CH. The interlayer insulating layer 301 may be disposed between the components disposed between the substrate 300 and the insulating layer 408.

The insulating layer 408 and the anti-reflection layer 407 may be sequentially stacked on the first to fourth lower overlay keys 310 to 340 in the third direction Z. The interlayer insulating layer 301 may be disposed between the components disposed between the substrate 300 and the insulating layer 408 on the overlay key area OA1.

FIG. 7C is an exemplary cross-sectional view of a semiconductor substrate taken along line A-A' of FIG. 5. Hereinafter, a method of manufacturing a semiconductor device according to some embodiments of the present disclosure which may be applied to a logic device will be described with reference to FIG. 7C. Differences from the memory devices shown in FIG. 7A will be mainly described.

The logic device may include a central processing unit (CPU), a graphics processing unit (GPU), a neural processing unit (NPU), and/or a data processing unit (DPU), or the like but the technical spirit of the present disclosure is not limited to the example of the logic device.

For example, a transistor TR, the interlayer insulating layer 301, the anti-reflection layer 407, and a third chip pattern HP3 may be formed on the substrate 300 in the chip area CA. For example, the first to fourth lower overlay keys 310 to 340, the interlayer insulating layer 301, the anti-reflection layer 407, and the first to fourth upper overlay keys 410 to 440 may be formed on the substrate 300 in the overlay key area OA.

The substrate 300, the interlayer insulating layer 301, the anti-reflection layer 407, the third upper layer HL3, the third lower layer LL3, the third chip pattern HP3, the first to fourth lower overlay keys 310 to 340, and the first to fourth upper overlay keys 410 to 440 correspond to the substrate 300, the interlayer insulating layer 301, the anti-reflection layer 407, the third upper layer HL3, the third lower layer LL3, the third chip pattern HP3, the first to fourth lower overlay keys 310 to 340, and the first to fourth upper overlay keys 410 to 440 of FIG. 7A, respectively. The descriptions thereof will be omitted.

A plurality of transistors TR may be disposed on the substrate 300, and each transistor TR may include a source/drain region 307. As described with reference to FIG. 7A, the third hole pattern HP3 and the source/drain region 307 may be aligned in the third direction Z through the disposition of the first to fourth lower overlay keys 310 to 340 and the first to fourth upper overlay keys 410 to 440. For example, in such an alignment, a photomask for forming the third hole pattern HP3 may have overlay key patterns corresponding to the first to fourth upper overlay keys 410 to 440 (e.g., the first_fifth pattern 415 of the first upper overlay key 410 and the second upper overlay key 420 as shown in FIG. 7C), and the overlay key patterns of the photomask may be aligned with the first to fourth lower overlay keys 310 to 340 such that the third hole pattern HP3 aligned with the source/drain region 307 may be formed via exposure and etching or exposure and developing using the photomask. In some embodiment, the first to fourth upper overlay keys 410 to 440 may be used as reference overlay keys for subsequent exposure and etching or exposure and developing. A contact penetrating the interlayer insulating layer 301 may be formed along the third hole pattern HP3, and the contact may electrically connect the plurality of transistors TR to external wires.

Referring to FIG. 3, in a method of manufacturing a semiconductor device according to some embodiments, a plurality of regions of interest (ROI) are set for each overlay using the overlay error detection device 1 of FIG. 1 (step S130). Hereinafter, the first to fourth lower overlay keys 310 to 340, and the first to fourth upper overlay keys 410 to 440 are assumed to be reference overlay keys for aligning a photomask thereto. In some embodiments, each ROI may be a region of the semiconductor substrate 30 overlapping at least one reference overlay key (e.g., at least one of the first to fourth lower overlay keys 310 to 340, and the first to fourth upper overlay keys 410 to 440) and being illuminated with the measurement light L of the overlay error detection device 1.

Figure 8:
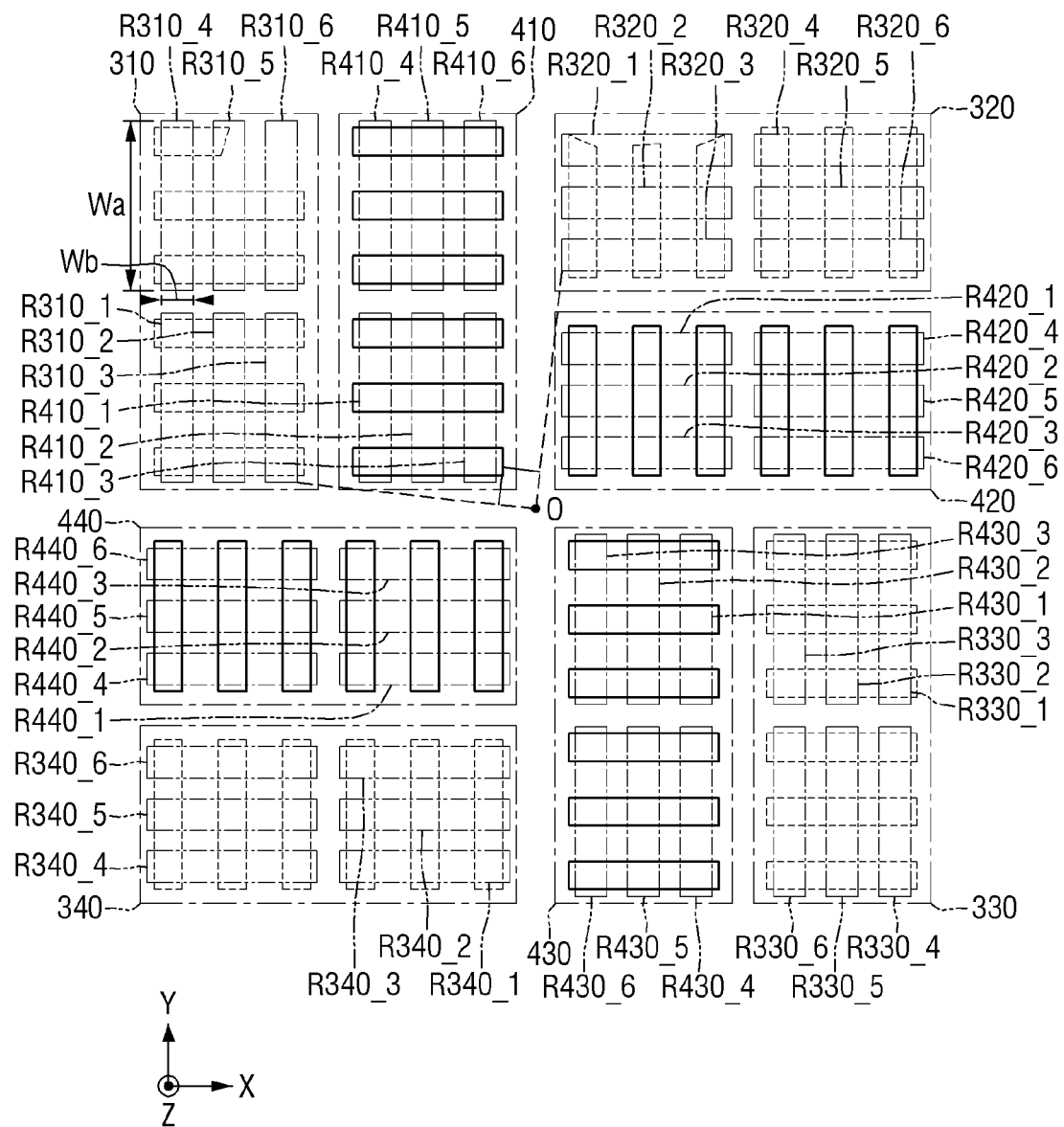
FIG. 8 is a diagram illustrating an ROI for an overlay key area of FIG. 6.

FIG. 8 is a diagram for describing an ROI for an overlay key area of FIG. 6. Referring to FIGS. 6 and 8, with respect to the first lower overlay key 310, a first_first lower ROI R310_1 is set over the first_fourth to first_sixth lower patterns 314 to 316, and has a long side with a length of a first width Wa and a short side with a length of a second width Wb. A first_second lower ROI R310_2 is set over the first_fourth to first_sixth lower patterns 314 to 316 without overlapping the first_first lower ROI R310_1 in a plan view, and has a long side with a length of a first width Wa and a short side with a length of a second width Wb. A first_third lower ROI R310_3 is set over the first_fourth to first_sixth lower patterns 314 to 316 without overlapping the first_first and first_second lower ROIs R310_1 and R310_2 in a plan view, and has a long side with a length of a first width Wa and a short side with a length of a second width Wb. A first_fourth lower ROI R310_4 is set over the first_first to first_third lower patterns 311 to 313 without overlapping the first_first to first_third lower ROIs R310_1 to R310_3 in a plan view, and has a long side with a length of a first width Wa and a short side with a length of a second width Wb. A first_fifth lower ROI R310_5 is set over the first_first to first_third lower patterns 311 to 313 without overlapping the first_first to first_fourth lower ROIs R310_1 to R310_4 in a plan view, and has a long side with a length of a first width Wa and a short side with a length of a second width Wb. A first_sixth lower ROI R310_6 is set over the first_first to first_third lower patterns 311 to 313 without overlapping the first_first to first_fifth lower ROIs R310_1 to R310_5 in a plan view, and has a long side with a length of a first width Wa and a short side with a length of a second width Wb.

The disposition relationship between the first lower overlay key 310 and the first to sixth lower ROIs R310_1 to R310_6 may also be applied to the disposition relationship between the second lower overlay key 320 and second_first to second_sixth lower ROIs R320_1 to R320_6, the disposition relationship between the third lower overlay key 330 and third_first to third_sixth lower ROIs R330_1 to R330_6, the disposition relationship between the fourth lower overlay key 340 and fourth_first to fourth_sixth lower ROIs R340_1 to R340_6, the disposition relationship between the first upper overlay key 410 and first_first to first_sixth upper ROIs R410_1 to R410_6, the disposition relationship between the second upper overlay key 420 and second_first to second_sixth upper ROIs R420_1 to R420_6, the disposition relationship between the third upper overlay key 430 and third_first to third_sixth upper ROIs R430_1 to R430_6, and the disposition relationship between the fourth upper overlay key 440 and fourth_first to fourth_sixth upper ROIs R440_1 to R440_6. The descriptions thereof are omitted.

The second_first lower ROI R320_1 may be disposed by being rotated 90° clockwise about the origin O of the overlay area OA1 with respect to the first_first lower ROI R310_1, the third_first lower ROI R330_1 may be disposed by being rotated 90° clockwise about the origin O of the overlay area OA1 with respect to the second_first lower ROI R320_1, and the fourth_first lower ROI R340_1 may be disposed by being rotated by 90° clockwise about the origin O of the overlay area OA1 with respect to the third_first lower ROI R330_1.

Similarly, the disposition relationship between the first_first to fourth_first lower ROIs R310_1 to R340_1 may also be applied to the disposition relationship between the first_second to fourth_second lower ROIs R310_2 to R340_2, the disposition relationship between the first_third to fourth_third lower ROIs R310_3 to R340_3, the disposition relationship between the first_fourth to fourth_fourth lower ROIs R310_4 to R340_4, the disposition relationship between the first_fifth to fourth_fifth lower ROIs R310_5 to R340_5, the disposition relationship between the first_sixth to fourth_sixth lower ROIs R310_6 to R340_6, the disposition relationship between the first_first to fourth_first upper ROIs R410_1 to R440_1, the disposition relationship between the first_second to fourth_second upper ROIs R410_2 to R440_2, the disposition relationship between the first_third to fourth_third upper ROIs R410_3 to R440_3, the disposition relationship between the first_fourth to fourth_fourth upper ROIs R410_4 to R440_4, the disposition relationship between the first_fifth to fourth_fifth upper ROIs R410_5 to R440_5, and the disposition relationship between the first_sixth to fourth_sixth upper ROIs R410_6 to R440_6. The descriptions thereof are omitted.

Figure 9:
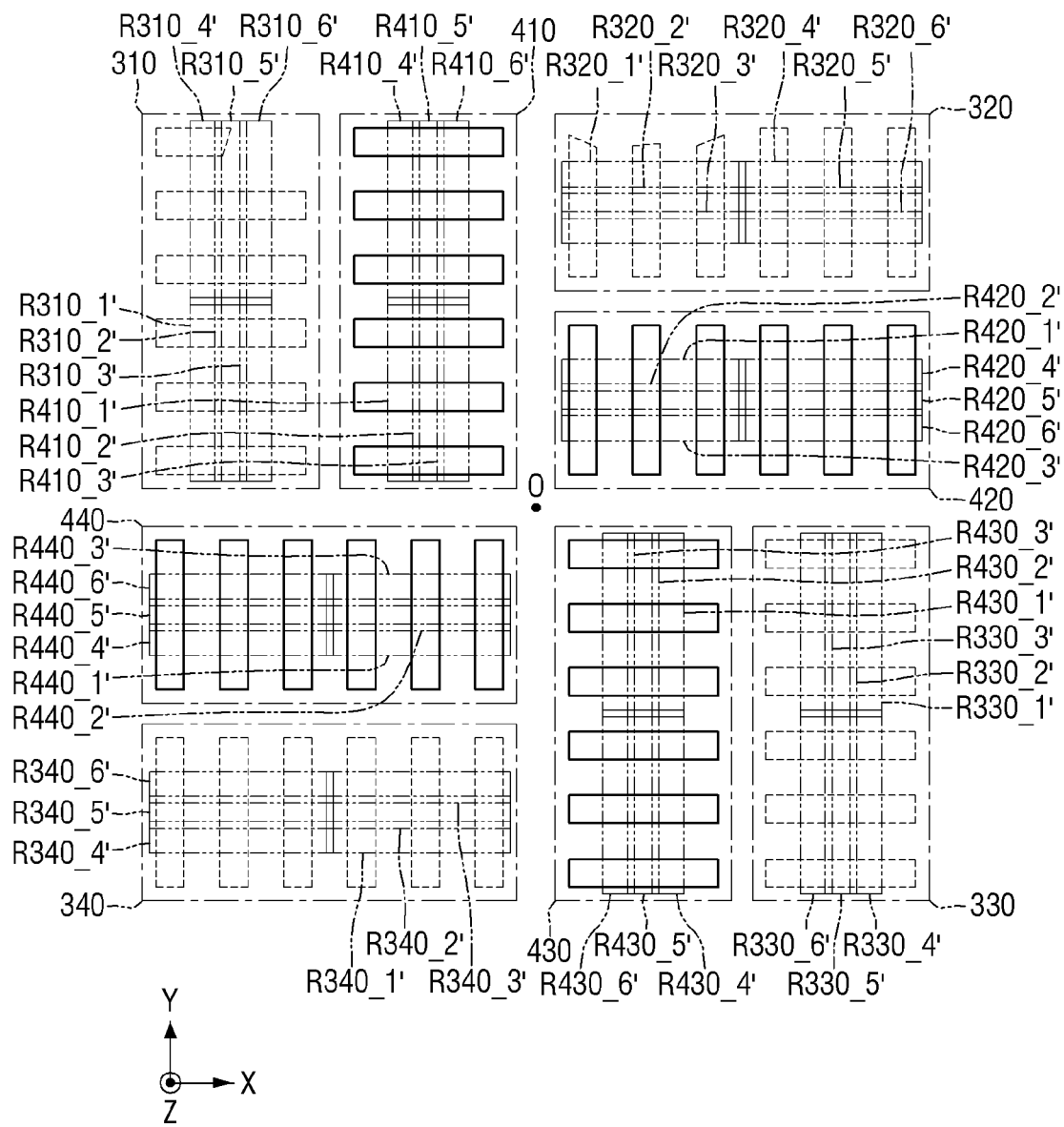
FIG. 9 is a diagram illustrating still another ROI for an overlay key area of FIG. 6.

FIG. 9 is a diagram illustrating an ROI for an overlay key area of FIG. 6. Hereinafter, the ROI setting (step S130, refer to FIG. 3) of a method of manufacturing a semiconductor device according to some embodiments of the present disclosure will be described with reference to FIG. 9. A description will be made focusing on differences from the ROI setting (step S130) illustrated in FIG. 8.

Unlike the ROI setting of FIG. 8, at least a part of a first_first lower ROI R310_1' may overlap a first_second lower ROI R310_2', a first_fourth lower ROI R310_4', and a first_fifth lower ROI R310_5' in a plan view. At least a part of the first_second lower ROI R310_2' may overlap the first_first lower ROI R310_1', the first_third lower ROI R310_3', the first_fourth lower ROI R310_4', the first_fifth lower ROI R310_5', and a first_sixth lower ROI R310_6' in a plan view. At least a part of the first_third lower ROI R310_3' may overlap the first_second lower ROI R310_2', the first_fifth lower ROI R310_5', and the first_sixth lower ROI R310_6' in a plan view. At least a part of the first_fourth lower ROI R310_4' may overlap the first_first lower ROI R310_1', the first_second lower ROI R310_2', and the first_fifth lower ROI R310_5' in a plan view. At least a part of the first_fifth lower ROI R310_5' may overlap the first_first lower ROI R310_1', the first_second lower ROI R310_2', the first_third lower ROI R310_3', the first_fourth lower ROI R310_4', and a first_sixth lower ROI R310_6' in a plan view. At least a part of the first_sixth lower ROI R310_6' may overlap the first_second lower ROI R310_2', the first_third lower ROI R310_3', and the first_fifth lower ROI R310_5' in a plan view.

Similarly, the disposition relationship between the first to sixth lower ROIs R310_1' to R310_6' may also be applied to the disposition relationship between the second_first to second_sixth lower ROIs R320_1' to R320_6', the disposition relationship between the third_first to third_sixth lower ROIs R330_1' to R330_6', the disposition relationship between the fourth_first to fourth_sixth lower ROIs R340_1' to R340_6', the disposition relationship between the first_first to first_sixth upper ROIs R410_1' to R410_6', the disposition relationship between the second_first to second_sixth upper ROIs R420_1' to R420_6', the disposition relationship between the third_first to third_sixth upper ROIs R430_1' to R430_6', and the disposition relationship between the fourth_first to fourth_sixth upper ROIs R440_1' to R440_6'. The descriptions thereof are omitted.

Referring to FIG. 3, in a method of manufacturing a semiconductor device according to some embodiments, a detection value of an overlay error is measured by measuring an overlay for a plurality of ROIs through the overlay error detection device 1 of FIG. 1 (step S140).

Referring to FIGS. 8 and 10 to 12, the overlay error detection device 1 of FIG. 1 may irradiate each ROI with the measurement light L (refer to FIG. 1) and measure the reflection light (i.e., reflected light of the measurement light L), thereby determining the degree of alignment of the pattern of the upper layer HL1 (FIG. 7A) with respect to the first lower layer LL1 having the first to fourth lower overlay keys 310 to 340, for example, and the components on the substrate 300 (FIG. 7A).

In a method of manufacturing a semiconductor device according to some embodiments, the overlay error detection device 1 may irradiate the first_first to fourth_first lower ROIs R310_1 to R340_1 and the first_first to fourth_first upper ROIs R410_1 to R440_1 simultaneously with a first measurement light L1 that has a first center frequency $\lambda C\_R\_1$ and a first bandwidth $BW\_R\_1$, thereby performing each measurement of the first to fourth lower and upper ROIs R310 to R340 and R410 to R440. The first_first to fourth_first lower ROIs R310_1 to R340_1 and the first_first to fourth_first upper ROIs R410_1 to R440_1 are collectively referred to as a first group R_1.

The degree of alignment in the second direction Y may be measured by irradiating the first_first and third_first lower ROIs R310_1 and R330_1 and the first_first and third_first upper ROIs R410_1 and R430_1 with the first measurement light L1, and the degree of alignment in the first direction X may be measured by irradiating the second_first and fourth_first lower ROIs R320_1 and R340_1 and the second_first and fourth_first upper ROIs R420_1 and R440_1 with the first measurement light L1.

The overlay error detection device 1 may measure a first kernel 3 sigma $3\sigma\_R\_1$, a first period ratio Periodic_Ratio_R_1, and a first contrast $CP\_R\_1$ through the reflected first measurement light L1, and a first detection value Residual_R_1 of a first overlay error may be detected through the measurement values. The first detection value is a figure indicating the degree of the first overlay error. The first detection value may include or may be formed of percentage. The present invention is not limited thereto.

The memory 220 of the overlay error detection device 1 may store the disposition information (e.g., locations within the semiconductor substrate 30) of the first_first to fourth_first lower ROIs R310_1 to R340_1 and the first_first to fourth_first upper ROIs R410_1 to R440_1, the recipe information (e.g., the first center frequency $\lambda C\_R\_1$ and the first bandwidth $BW\_R\_1$) for the first measurement light, a detection value for a first overlay error, and the like, in a first output file OutputFile_R_1.

In a method of manufacturing a semiconductor device according to some embodiments, the overlay error detection device 1 may irradiate the first_second to fourth_second lower ROIs R310_2 to R340_2 and the first_second to fourth_second upper ROIs R410_2 to R440_2 simultaneously with a second measurement light L2 that has a second center frequency $\lambda C\_R\_2$ and a second bandwidth $BW\_R\_2$, thereby performing each measurement of the first to fourth lower and upper ROIs R310 to R340 and R410 to R440. The first_second to fourth_second lower ROIs R310_2 to R340_2 and the first_second to fourth_second upper ROIs R410_2 to R440_2 are collectively referred to as a second group R_2.

The degree of alignment in the second direction Y may be measured by irradiating the first_second and third_second lower ROIs R310_2 and R330_2 and the first_second and third_second upper ROIs R410_2 and R430_2 with the second measurement light L2, and the degree of alignment in the first direction X may be grasped by irradiating the second_second and fourth_second lower ROIs R320_2 and R340_2 and the second_second and fourth_second upper ROIs R420_2 and R440_2 with the second measurement light L2.

The overlay error detection device 1 may measure a second kernel 3 sigma $3\sigma\_R\_2$, a second period ratio Periodic_Ratio_R_2, and a second contrast CP_R_2 through the reflected second measurement light L2, and a second detection value Residual_R_2 of a second overlay error may be detected through the measurement values.

The memory 220 of the overlay error detection device 1 may store the disposition information (e.g., locations within the semiconductor substrate 30) of the first_second to fourth_second lower ROIs R310_2 to R340_2 and the first_second to fourth_second upper ROIs R410_2 to R440_2, the recipe information (e.g., the second center frequency $\lambda C\_R\_2$ and the second bandwidth $BW\_R\_2$) for the second measurement light L2, a detection value for a second overlay error, and the like, in a second output file OutputFile_R_2.

In a method of manufacturing a semiconductor device according to some embodiments, the overlay error detection device 1 may irradiate the first_third to fourth_third lower ROIs R310_3 to R340_3 and the first_third to fourth_third upper ROIs R410_3 to R440_3 simultaneously with a third measurement light that has a third center frequency $\lambda C\_R\_3$ and a third bandwidth $BW\_R\_3$, thereby performing each measurement of the first to fourth lower and upper ROIs R310 to R340 and R410 to R440. The first_third to fourth_third lower ROIs R310_3 to R340_3 and the first_third to fourth_third upper ROIs R410_3 to R440_3 are collectively referred to as a third group R_3.

The degree of alignment in the second direction Y may be measured by irradiating the first_third and third-third lower ROIs R310_3 and R330_3 and the first_third and third-third upper ROIs R410_3 and R430_3 with the third measurement light, and the degree of alignment in the first direction X may be measured by irradiating the second-third and fourth_third lower ROIs R320_3 and R340_3 and the second-third and fourth_third upper ROIs R420_3 and R440_3 with the third measurement light.

The overlay error detection device 1 may measure a third kernel 3 sigma $3\sigma\_R\_3$, a third period ratio Periodic_Ratio_R_3, and a third contrast CP_R_3 through the reflected third measurement light, and a third detection value Residual_R_3 of a third overlay error may be detected through the measurement value.

The memory 220 of the overlay error detection device 1 may store the disposition information of the first_third to fourth_third lower ROIs R310_3 to R340_3 and the first_third to fourth_third upper ROIs R410_3 to R440_3, the recipe information for the third measurement light, a detection value for a first overlay error, and the like, in a third output file OutputFile_R_3.

In a method of manufacturing a semiconductor device according to some embodiments, the overlay error detection device 1 may irradiate the first_fourth to fourth_fourth lower ROIs R310_4 to R340_4 and the first_fourth to fourth_fourth upper ROIs R410_4 to R440_4 simultaneously with a fourth measurement light that has a fourth center frequency $\lambda C\_R\_4$ and a fourth bandwidth $BW\_R\_4$, thereby performing each measurement of the first to fourth lower and upper ROIs R310 to R340 and R410 to R440. The first_fourth to fourth_fourth lower ROIs R310_4 to R340_4 and the first_fourth to fourth_fourth upper ROIs R410_4 to R440_4 are collectively referred to as a fourth group R_4.

The degree of alignment in the second direction Y may be measured by irradiating the first_fourth and third_fourth lower ROIs R310_4 and R330_4 and the first_fourth and third_fourth upper ROIs R410_4 and R430_4 with the fourth measurement light, and the degree of alignment in the first direction X may be measured by irradiating the second_fourth and fourth_fourth lower ROIs R320_4 and R340_4 and the second_fourth and fourth_fourth upper ROIs R420_4 and R440_4 with the fourth measurement light.

The overlay error detection device 1 may measure a fourth kernel 3 sigma $3\sigma\_R\_4$, a fourth period ratio Periodic_Ratio_R_4, and a fourth contrast CP_R_4 through the reflected fourth measurement light, and a fourth detection value Residual_R_1 of a fourth overlay error may be detected through the measurement values.

The memory 220 of the overlay error detection device 1 may store the disposition information (e.g., locations within the semiconductor substrate 30) of the first_fourth to fourth_fourth lower ROIs R310_4 to R340_4 and the first_fourth to fourth_fourth upper ROIs R410_4 to R440_4, the recipe information (e.g., the fourth center frequency $\lambda C\_R\_4$ and the fourth bandwidth $BW\_R\_4$) for the fourth measurement light, a detection value for a fourth overlay error, and the like, in a fourth output file OutputFile_R_1.

In a method of manufacturing a semiconductor device according to some embodiments, the overlay error detection device 1 may irradiate the first_fifth to fourth_fifth lower ROIs R310_5 to R340_5 and the first_fifth to fourth_fifth upper ROIs R410_5 to R440_5 simultaneously with a fifth measurement light that has a fifth center frequency $\lambda C\_R\_5$ and a fifth bandwidth $BW\_R\_5$, thereby performing each measurement of the first to fourth lower and upper ROIs R310 to R340 and R410 to R440. The first_fifth to fourth_fifth lower ROIs R310_5 to R340_5 and the first_fifth to fourth_fifth upper ROIs R410_5 to R440_5 are collectively referred to as a fifth group R_5.

The degree of alignment in the second direction Y may be measured by irradiating the first_fifth and third_fifth lower ROIs R310_5 and R330_5 and the first_fifth and third_fifth upper ROIs R410_5 and R430_5 with the fifth measurement light, and the degree of alignment in the first direction X may be measured by irradiating the second_fifth and fourth_fifth lower ROIs R320_5 and R340_5 and the second_fifth and fourth_fifth upper ROIs R420_5 and R440_5 with the fifth measurement light.

The overlay error detection device 1 may measure a fifth kernel 3 sigma 3 σ_R_5, a fifth period ratio Periodic_Ratio_R_5, and a fifth contrast CP_R_5 through the reflected fifth measurement light, and a fifth detection value Residual_R_5 of a fifth overlay error may be detected through the measurement values.

The memory 220 of the overlay error detection device 1 may store the disposition information (e.g., locations within the semiconductor substrate 30) of the first_fifth to fourth_fifth lower ROIs R310_5 to R340_5 and the first_fifth to fourth_fifth upper ROIs R410_5 to R440_5, the recipe information (e.g., the fifth center frequency λC_R_5 and the fifth bandwidth BW_R_5) for the fifth measurement light, a detection value for a fifth overlay error, and the like, in a fifth output file OutputFile_R_5.

In a method of manufacturing a semiconductor device according to some embodiments, the overlay error detection device 1 may irradiate the first_sixth to fourth_sixth lower ROIs R310_6 to R340_6 and the first_sixth to fourth_sixth upper ROIs R410_6 to R440_6 simultaneously with a sixth measurement light that has a sixth center frequency λC_R_6 and a sixth bandwidth BW_R_6, thereby performing each measurement of the first to fourth lower and upper ROIs R310 to R340 and R410 to R440. The first_sixth to fourth_sixth lower ROIs R310_6 to R340_6 and the first_sixth to fourth_sixth upper ROIs R410_6 to R440_6 are collectively referred to as a sixth group R_6.

The degree of alignment in the second direction Y may be measured by irradiating the first_sixth and third_sixth lower ROIs R310_6 and R330_6 and the first_sixth and third_sixth upper ROIs R410_6 and R430_6 with the sixth measurement light, and the degree of alignment in the first direction X may be measured by irradiating the second_sixth and fourth_sixth lower ROIs R320_6 and R340_6 and the second_sixth and fourth_sixth upper ROIs R420_6 and R440_6 with the sixth measurement light.

The overlay error detection device 1 may measure a sixth kernel 3 sigma 3σ_R_6, a sixth period ratio Periodic_Ratio_R_6, and a sixth contrast CP_R_6 through the reflected sixth measurement light, and a sixth detection value Residual_R_6 of a sixth overlay error may be detected through the measurement values.

The memory 220 of the overlay error detection device 1 may store the disposition information (e.g., locations within the semiconductor substrate 30) of the first_sixth to fourth_sixth lower ROIs R310_6 to R340_6 and the first_sixth to fourth_sixth upper ROIs R410_6 to R440_6, the recipe information (e.g., the sixth center frequency λC_R_6 and the sixth bandwidth BW_R_6) for the sixth measurement light, a detection value for a sixth overlay error, and the like, in a sixth output file OutputFile_R_6.

Figure 11:
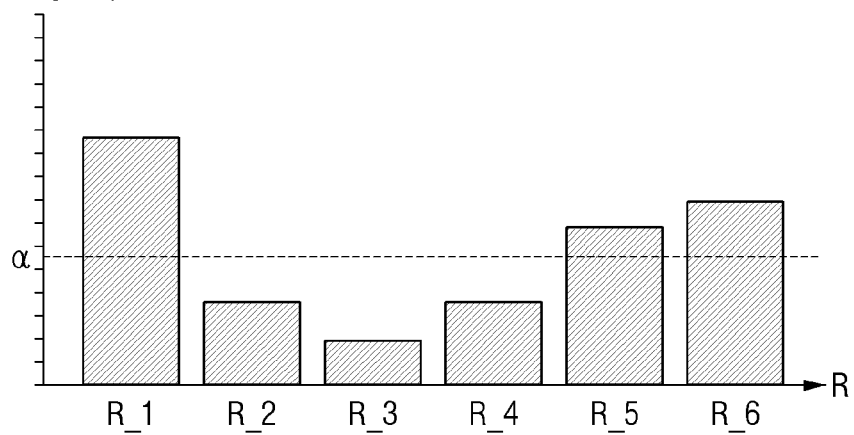

Referring to FIGS. 6, 8, and 11, a kernel 3 sigma value for a third group R_3 corresponding to the first_third to fourth_third lower ROIs R310_3 to R340_3 and the first_third to fourth_third upper ROIs R410_3 to R440_3 is measured to be the lowest among the first to sixth groups R_1 to R_6. This is because in the first_third to fourth_third lower ROIs R310_3 to R340_3, the measurement is not performed on the first_first lower pattern 311 and the second_fourth to second_sixth lower patterns 324 to 326, which are defective patterns in which a partial area has been damaged.

The first group R_1 including the second_first lower ROI R320_1 in which the measurement is performed on the second_fourth to second_sixth lower patterns 324 to 326, has a kernel 3 sigma value that is measured to be the highest among the first to sixth groups R_1 to R_6.

The overlay error detection device 1 according to some embodiments may set an ROI by avoiding the first, fifth, and sixth groups R_1, R_5, and R_6 that exceed a predetermined threshold value a of the Kernel 3 sigma. In some embodiments, the predetermined threshold value a may be empirically determined.

Figure 12:
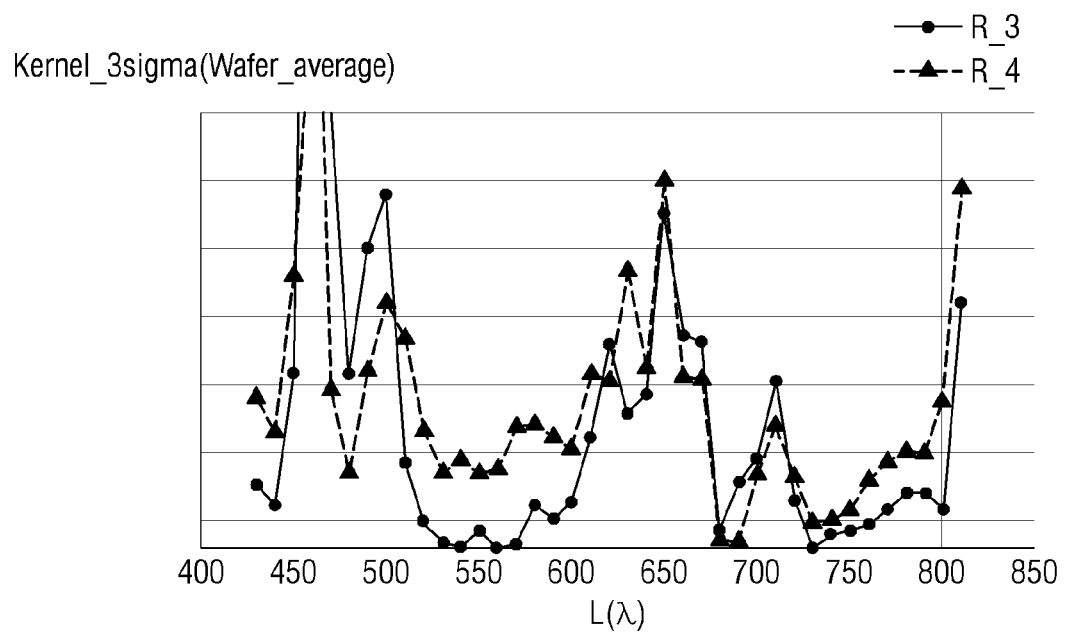

Referring to FIG. 12, it may also check the fluctuation of the detection value in which the kernel 3 sigma value fluctuates even at the same ROI according to the fluctuation of the center wavelength λ of the measurement light L.

Figure 13:
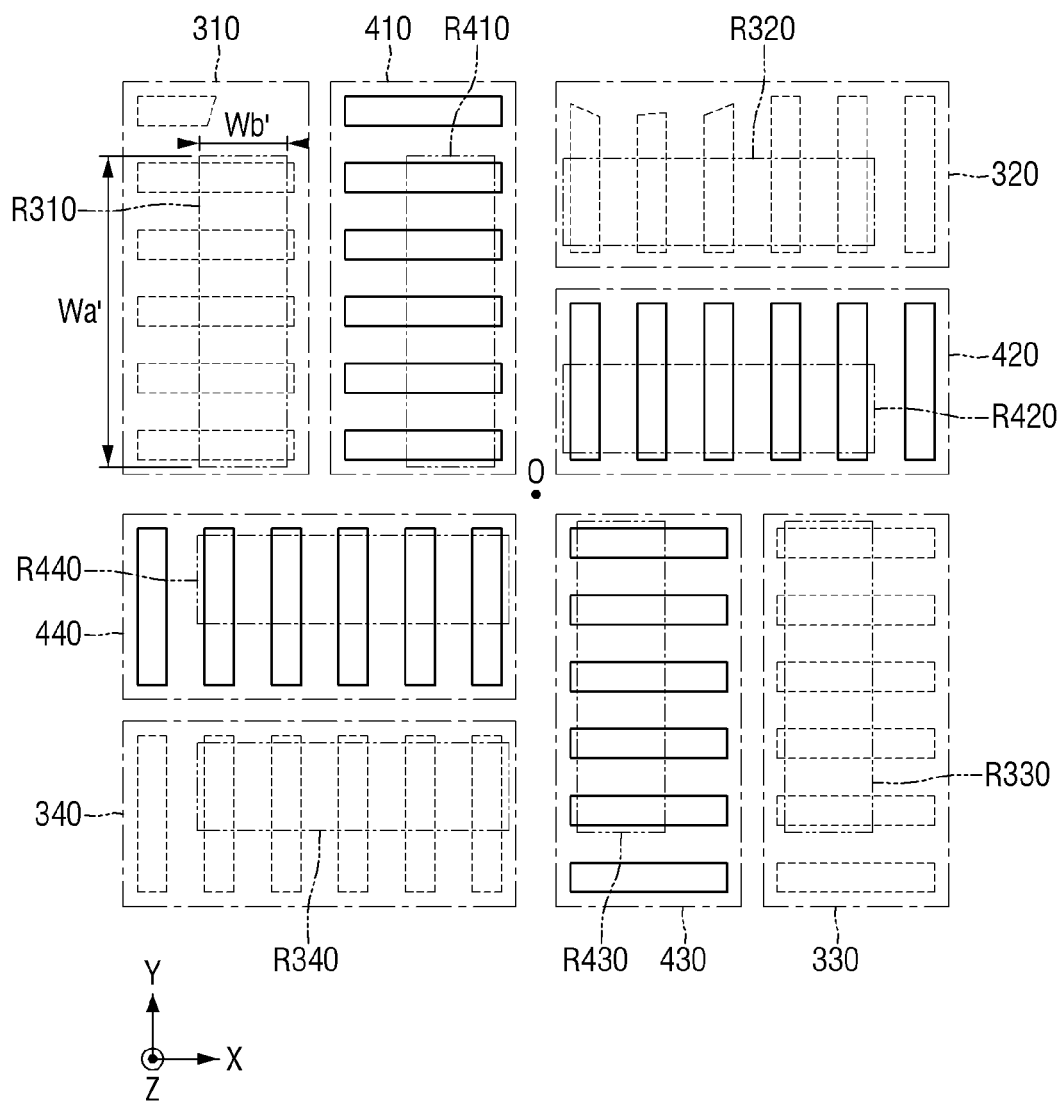
FIG. 13 is a diagram illustrating an adjusted ROI for the overlay key area of FIG. 6.

Referring to FIGS. 3 and 13, in a method of manufacturing a semiconductor device according to some embodiments, the overlay error detection device 1 sets an adjusted ROI for an overlay key based on the detection value of the overlay error of FIGS. 11 and 12 (step S150).

The overlay error detection device 1 sets the first lower ROI R310 over the first_second to first_sixth lower patterns 311 to 315 with respect to the first lower overlay key 310, and has a long side with a length of a third width Wa' and a short side with a length of a fourth width Wb'. The first ROI R310 does not overlap the first_first lower pattern 311 which is damaged. With respect to the second lower overlay key 320, the second lower ROI R320 is set over the second_second to second_sixth lower patterns 322 to 326, and has a long side with a length of a third width Wa' and a short side with a length of a fourth width Wb'. The second lower ROI R320 may overlap portions of the second_second to second_sixth lower patterns 322 to 326, without overlapping damage portions of thereof. The third lower ROI R330 is set over the third_second to third_sixth lower patterns 332 to 336, and has a long side with a length of a third width Wa' and a short side with a length of a fourth width Wb'. The fourth lower ROI R340 is set over the fourth_second to fourth_sixth lower patterns 342 to 346, and has a long side with a length of a third width Wa' and a short side with a length of a fourth width Wb'.

The length of the third width Wa' may be different from the first width Wa of FIG. 8, the length of the fourth width Wb' may be different from the second width Wb of FIG. 8, and according to an embodiment, the length of the third width Wa' may be greater than the first width Wa, and the length of the fourth width Wb' may be greater than the second width Wb.

Referring to FIG. 3, in a method of manufacturing a semiconductor device according to some embodiments, a detection value of an overlay error is measured by measuring an overlay for an adjusted ROI through the overlay error detection device 1 (step S160).

The overlay error detection device 1 may irradiate each adjusted ROI with the measurement light L (refer to FIG. 1) and measure the reflection light, thereby determining the degree of alignment of the pattern of the upper layer HL1 (FIG. 7A) and the components on the substrate 300 (FIG. 7A).

In a method of manufacturing a semiconductor device according to some embodiments, the overlay error detection device 1 performs the steps S130 and S140 to set an adjusted ROI, measure the overlay, and measure the detection value of the overlay error. With the adjusted ROI, not only the overlay measurement may be performed excluding the defective pattern, but also the recipe of the measurement light may be optimized according to the recipe information of the measurement light, and thus, the reliability of the overlay measurement may be improved.

Figure 14:
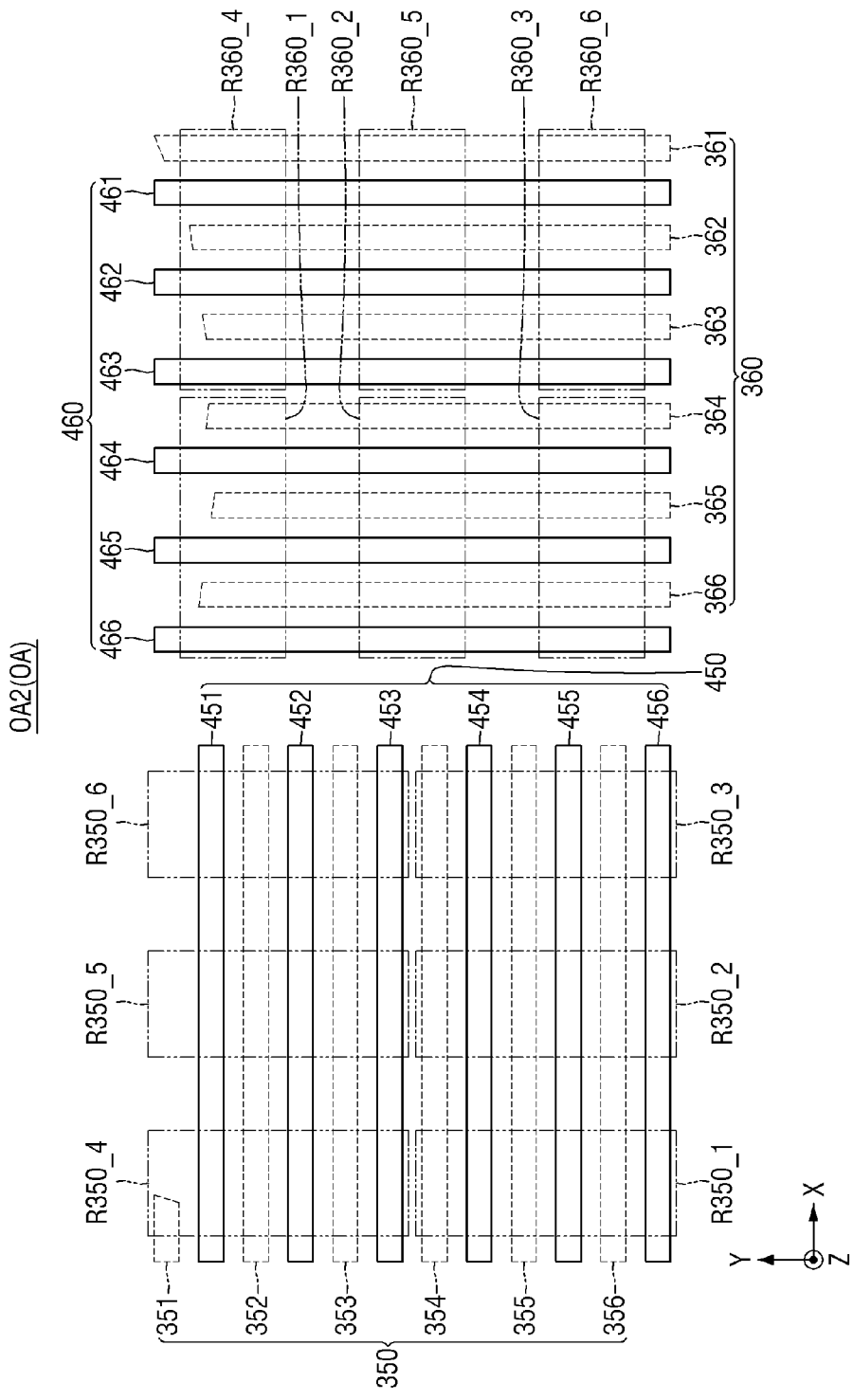
FIG. 14 is a diagram illustrating an overlay key of a semiconductor substrate according to still some other embodiments of the present disclosure.

FIG. 14 is a diagram illustrating an overlay key of a semiconductor substrate according to some embodiments of the present disclosure.

Hereinafter, an overlay key area OA2 of the semiconductor substrate 30 according to some embodiments of the present disclosure will be described with reference to FIG. 14. A description will be made focusing on differences from the overlay key area OA1 illustrated in FIG. 6.

Fifth and sixth lower overlay keys 350 and 360 and fifth and sixth upper overlay keys 450 and 460 may be disposed on the overlay key area OA2.

The fifth lower overlay key 350 may include fifth_first to fifth_sixth lower patterns 351 to 356, the sixth lower overlay key 360 may include sixth_first to sixth_sixth lower patterns 361 to 366, the fifth upper overlay key 450 may include fifth_first to fifth_sixth upper patterns 451 to 456, and the sixth upper overlay key 460 may include sixth_first to sixth_sixth upper patterns 461 to 466.

The fifth and sixth lower overlay keys 350 and 360 may correspond to the first and second lower overlay keys 310 and 320 of FIG. 6, respectively, and the fifth and sixth upper overlay keys 450 and 460 may correspond to the first and second upper overlay keys 410 and 420 of FIG. 6, respectively.

The fifth lower overlay key 350 may overlap the fifth upper overlay key 450 in a plan view, the sixth lower overlay key 360 may overlap the sixth upper overlay key 460 in a plan view, and the fifth_first to fifth_sixth lower patterns 351 to 356 included in the fifth lower overlay key 350 do not overlap the fifth_first to fifth_sixth upper patterns 451 to 456 included in the fifth upper overlay key 450 in a plan view. The fifth_first to fifth_sixth lower patterns 351 to 356, and the fifth_first to fifth_sixth upper patterns 451 to 456 may be alternately arranged in the second direction Y. For example, the fifth_second lower pattern 452 may be disposed between the fifth_first and fifth_second upper patterns 451 and 452, and the fifth_first upper pattern 451 may be disposed between the fifth_first and fifth_second lower patterns 351 and 352. This disposition may also be applied to the sixth lower overlay key 360 and the sixth upper overlay key 460.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise For example indicated. Accordingly, it will be understood by those of skill in the art that various changes in form and details may be made without departing from the spirit and scope of the present invention as set forth in the following claims.

What is claimed is:

1. A method of manufacturing a semiconductor device, comprising:
   forming a first lower overlay key including first and second patterns in a lower layer;
   forming a first upper overlay key including third and fourth patterns in an upper layer vertically disposed on the lower layer;
   irradiating a first measurement light to a first region of interest (ROI) over first portions of the first and second patterns to detect a first overlay error; and
   irradiating a second measurement light to a second ROI over second portions of the first and second patterns, the second ROI being different from the first ROI, to detect a second overlay error, wherein the second measurement light has a different central frequency than the first measurement light.

2. The method of claim 1, further comprising:
   irradiating the first measurement light to a third ROI over first portions of the third and fourth patterns to detect the first overlay error; and
   irradiating the second measurement light to a fourth ROI over second portions of the third and fourth patterns, the fourth ROI being different from the third ROI, to detect the second overlay error.

3. The method of claim 1,
   wherein the first to fourth patterns are photoresist patterns.

4. The method of claim 1,
   wherein at least a part of the first ROI overlaps the second ROI in a plan view.

5. The method of claim 1,
   wherein the first and second patterns and the third and fourth patterns do not overlap each other in a plan view.

6. The method of claim 1, further comprising:
   setting an adjusted ROI over the first lower overlay key based on a first detection value of the first overlay error and a second detection value of the second overlay error; and
   irradiating a measurement light to the adjusted ROI over the first lower overlay key to detect an adjustment overlay error.

7. The method of claim 6,
   wherein a length of a long side of the adjusted ROI extending in a first direction is different from a length of a long side of the first ROI extending in the first direction.

8. The method of claim 1, further comprising:
   forming a second lower overlay key including fifth and sixth patterns different from the first and second patterns on the lower layer,
   wherein the second lower overlay key is a congruent shape of the first lower overlay key and is disposed at a region which is determined by 90° rotation of the first lower overlay key about a point on the lower layer.

9. The method of claim 8, further comprising:
   irradiating the first measurement light to a fifth ROI over first portions of the fifth and sixth patterns to detect the first overlay error; and
   irradiating the second measurement light to a sixth ROI over second portions of the fifth and sixth patterns, the sixth ROI being different from the fifth ROI, to detect the second overlay error.

10. The method of claim 9,
    wherein the fifth ROI is a congruent shape of the first ROI and is disposed at a region determined by 90° rotation of the first ROI about the first point, and wherein the sixth ROI is a congruent shape of the second ROI and is disposed at a region determined by 90° rotation of the second ROI about the first point.

11. The method of claim 9,
wherein the first ROI and the fifth ROI are irradiated simultaneously with the first measurement light to detect the first overlay error, and
wherein the second ROI and the sixth ROI are irradiated simultaneously with the second measurement light to detect the second overlay error.

12. A method of manufacturing a semiconductor device, comprising:
forming a first lower overlay key including first and second patterns in a lower layer;
forming a first upper overlay key including third and fourth patterns in an upper layer vertically disposed on the lower layer;
irradiating a first measurement light to a first ROI over first portions of the third and fourth patterns to detect a first overlay error; and
irradiating a second measurement light to a second ROI over second portions of the third and fourth patterns, the second ROI being different from the first ROI, to detect a second overlay error,
wherein the second measurement light has a different central frequency than the first measurement light, and
wherein the third and fourth patterns are photoresist patterns.

13. The method of claim 12, further comprising:
irradiating the first measurement light to a third ROI over second portions of the first and second patterns to detect the first overlay error; and
irradiating the second measurement light to a fourth ROI over second portions of the third and fourth patterns, the fourth ROI being different from the third ROI, to detect the second overlay error.

14. The method of claim 12,
wherein at least a part of the first ROI overlaps the second ROI in a plan view.

15. The method of claim 12, further comprising,
setting an adjusted ROI over the first lower overlay key based on a first detection value of the first overlay error and a second detection value of the second overlay error; and
irradiating a measurement light to the adjusted ROI over the first lower overlay key to detect an adjustment overlay error.

16. The method of claim 15,
wherein a length of a long side of the adjusted ROI extending in a first direction is different from a length of a long side of the first ROI extending in the first direction.

17. A method of manufacturing a semiconductor device, comprising:
forming a first lower overlay key including first and second patterns extending in a first direction in a lower layer, and a second lower overlay key including third and fourth patterns in the lower layer, the third and fourth patterns extending in a second direction crossing the first direction, the second lower overlay key being a congruent shape of the first lower overlay key and being disposed at a region which is determined by 90° rotation of the first lower overlay key about a first point on the lower layer;
forming a first upper overlay key including fifth and sixth patterns extending in the first direction and a second upper overlay key including seventh and eighth patterns extending in the second direction, in an upper layer vertically disposed on the lower layer;
irradiating a first measurement light to a first_first ROI over first portions of the first and second patterns and a second_first ROI over first portions of the third and fourth patterns to detect a first overlay error, the second_first ROI being a congruent shape of the first_first ROI and being disposed at a region determined by 90° rotation of the first_first ROI about the first point; and
irradiating a second measurement light to a first_second ROI over second portions of the first and second patterns, the first_second ROI being different from the first_first ROI, and a second_second ROI over second portions of the third and fourth patterns, the second_second ROI being different from the second_first ROI, to detect a second overlay error, the second_second ROI being a congruent shape of the first_second ROI and being disposed at a region determined by 90° rotation of the first_second ROI about the first point,
wherein the second measurement light has a different central frequency than the first measurement light.

18. The method of claim 17, further comprising:
irradiating the first measurement light to a third_first ROI over first portions of the fifth and sixth patterns and a fourth_first ROI over first portions of the seventh and eighth patterns to detect the first overlay error, the fourth_first ROI being a congruent shape of the third_first ROI and being disposed at a region determined by 90° rotation of the third_first ROI about the first point; and
irradiating the second measurement light to a third_second ROI over the fifth and sixth patterns, the third_second ROI being different from the third_first ROI, and a fourth_second ROI over the seventh and eighth patterns to detect the second overlay error, the fourth_second ROI being different from the fourth_first ROI, the fourth_second ROI being a congruent shape of the third_second ROI and being disposed at a region determined by 90° rotation of the third_second ROI about the first point,
wherein the second upper overlay key is a congruent shape of the first upper overlay key and is disposed at a region determined by 90° rotation of the first upper overlay key about the first point.

19. The method of claim 17, further comprising,
setting an adjusted ROI over the first lower overlay key based on a first detection value of the first overlay error and a second detection value of the second overlay error;
irradiating a measurement light to the adjusted ROI over the first lower overlay key to detect an adjustment overlay error.

20. The method of claim 19,
wherein a length of a long side of the adjusted ROI extending in a first direction is different from a length of a long side of the first_first ROI extending in the first direction.

* * * * *